United States Patent
Zhang et al.

(10) Patent No.: US 10,644,829 B2
(45) Date of Patent: *May 5, 2020

(54) METHOD AND APPARATUS FOR ENCODING DATA USING A POLAR CODE

(71) Applicant: Huawei Technologies Co., Ltd., Shenzhen (CN)

(72) Inventors: Huazi Zhang, Hangzhou (CN); Jiajie Tong, Hangzhou (CN); Rong Li, Hangzhou (CN); Jun Wang, Hangzhou (CN); Wen Tong, Ottawa (CA); Yiqun Ge, Ottawa (CA); Xiaocheng Liu, Hangzhou (CN); Gongzheng Zhang, Hangzhou (CN); Jian Wang, Shenzhen (CN); Nan Cheng, Kanata (CA); Qifan Zhang, Lachine (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/699,976

(22) Filed: Sep. 8, 2017

(65) Prior Publication Data

US 2018/0076929 A1 Mar. 15, 2018

Related U.S. Application Data

(60) Provisional application No. 62/433,127, filed on Dec. 12, 2016, provisional application No. 62/432,416, (Continued)

(51) Int. Cl.
*H03M 13/00* (2006.01)
*H04L 1/00* (2006.01)
(Continued)

(52) U.S. Cl.
CPC .......... *H04L 1/0009* (2013.01); *H03M 13/11* (2013.01); *H03M 13/13* (2013.01);
(Continued)

(58) Field of Classification Search
CPC ............... H03M 13/11; H03M 13/611; H03M 13/6362; H03M 13/616; H03M 13/13;
(Continued)

(56) References Cited

U.S. PATENT DOCUMENTS 6,625,219 B1 9/2003 Stopler
8,386,879 B2 2/2013 Djordjevic et al.
(Continued)

FOREIGN PATENT DOCUMENTS

CN 102017428 A 4/2011
CN 103825669 A 5/2014
(Continued)

OTHER PUBLICATIONS

Niu, Kai et al.,"Polar Codes: Primary Concepts and Practical Decoding Algorithms," IEEE Communications Magazine, Jul. 2014, No. 7, vol. 52, ISSN:0163-6804, pp. 193-203.
(Continued)

*Primary Examiner* — Guerrier Merant
(74) *Attorney, Agent, or Firm* — Slater Matsil, LLP

(57) ABSTRACT

Embodiment techniques map parity bits to sub-channels based on their row weights. The row weight for a sub-channel may be viewed as the number of "ones" in the corresponding row of the Kronecker matrix or as a power of 2 with the exponent (i.e. the hamming weight) being the number of "ones" in the binary representation of the sub-channel index (further described below). In one embodiment, candidate sub-channels that have certain row weight values are reserved for parity bit(s). Thereafter, K information bits may be mapped to the K most reliable remaining
(Continued)

sub-channels, and a number of frozen bits (e.g. N–K) may be mapped to the least reliable remaining sub-channels. Parity bits may then mapped to the candidate sub-channels, and parity bit values are determined based on a function of the information bits.

28 Claims, 24 Drawing Sheets

Related U.S. Application Data filed on Dec. 9, 2016, provisional application No. 62/432,448, filed on Dec. 9, 2016, provisional application No. 62/402,862, filed on Sep. 30, 2016, provisional application No. 62/396,618, filed on Sep. 19, 2016, provisional application No. 62/395,312, filed on Sep. 15, 2016.

(51) Int. Cl.
  *H03M 13/13* (2006.01)
  *H03M 13/11* (2006.01)

(52) U.S. Cl.
  CPC ....... *H03M 13/611* (2013.01); *H03M 13/616* (2013.01); *H03M 13/6362* (2013.01); *H04L 1/0041* (2013.01); *H04L 1/0043* (2013.01); *H04L 1/0061* (2013.01); *H04L 1/0063* (2013.01); *H04L 1/0065* (2013.01)

(58) Field of Classification Search
  CPC .......... H03M 13/1111; H03M 13/1191; H03M 13/353; H04L 1/0009; H04L 1/0041; H04L 1/0043; H04L 1/0061; H04L 1/0063; H04L 1/0057; H04B 1/123; H04B 7/0413
  See application file for complete search history.

(56) References Cited

U.S. PATENT DOCUMENTS

| | | | |
|---|---|---|---|
| 9,628,113 | B2 | 4/2017 | Jeong et al. |
| 2002/0194571 | A1 | 12/2002 | Parr et al. |
| 2009/0271686 | A1 | 10/2009 | Jiang et al. |
| 2009/0307562 | A1 | 12/2009 | Lee et al. |
| 2012/0207224 | A1* | 8/2012 | Chow ............... H03M 13/1111 375/240.25 |
| 2014/0169388 | A1 | 6/2014 | Jeong et al. |
| 2014/0173376 | A1 | 6/2014 | Jeong et al. |
| 2014/0208183 | A1 | 7/2014 | Mahdavifar et al. |
| 2014/0281823 | A1* | 9/2014 | Micheloni ........... G06F 11/1012 714/773 |
| 2015/0039966 | A1 | 2/2015 | Fonseka et al. |
| 2015/0249473 | A1 | 9/2015 | Li et al. |
| 2016/0204811 | A1* | 7/2016 | Goela ................... H04B 1/123 375/260 |
| 2016/0308643 | A1 | 10/2016 | Li et al. |
| 2017/0187396 | A1 | 6/2017 | Jeong et al. |
| 2017/0338996 | A1 | 11/2017 | Sankar et al. |
| 2018/0034587 | A1 | 2/2018 | Kim et al. |
| 2018/0076929 | A1* | 3/2018 | Zhang ................... H03M 13/11 |
| 2019/0190655 | A1 | 6/2019 | Pan et al. |

FOREIGN PATENT DOCUMENTS

| | | |
|---|---|---|
| CN | 105009461 A | 10/2015 |
| CN | 105811998 A | 7/2016 |
| EP | 2849377 A1 | 3/2015 |
| KR | 20140077492 A | 6/2014 |
| WO | 2014092502 A1 | 6/2014 |
| WO | 2014102565 A1 | 7/2014 |
| WO | 2018201409 A1 | 11/2018 |

OTHER PUBLICATIONS

Huawei, HiSilicon: "Polar Code Construction for NR", 3GPP TSG RAN WG1 Meeting #86bis Lisbon, Portugal, Oct. 10-14, 2016, R1-1608862, 8 pages.

Huawei et al., "Channel coding for control channels," 3GPP TSG RAN WG1 Meeting #86, R1-167216, Aug. 22-26, 2016, 8 pages, Gothenburg, Sweden.

Huawei et al., "Channel coding schemes for mMTC scenario," 3GPP TSG RAN WG1 Meeting #86, R1-167215, Aug. 22-26, 2016, 9 pages, Gothenburg, Sweden.

Huawei et al., "Polar code design and rate matching," 3GPP TSG RAN WG1 Meeting #86, R1-167209, Aug. 22-26, 2016, 5 pages, Gothenburg, Sweden.

Arikan, Erdal, "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.

Trifonov, Peter et al.; "Polar Subcodes," IEEE Journal on Selected Areas in Communications, vol. 34, No. 2, Feb. 2016, pp. 254-266.

Wang, Tao et al., "Parity-Check-Concatenated Polar Codes," IEEE Communications Letters, vol. 20, No. 12, Dec. 2016, pp. 2342-2345.

Huawei, et al., "Details of the Polar code design", 3GPP TSG RAN WG1, Meeting #87, R1-1611254, Nov. 10-14, 2016, 15 Pages, Reno, USA.

Alsan, M., "Channel Polarization and Polar Codes", Technical Report, Information Theory Laboratory, School of Computer and Communications Sciences, Feb. 2012, 58 Pages.

Dai, J., et al., "Evaluation and Optimization of Gaussian Approximation for Polar Codes", arXiv:1511.07236v1, [cs.IT], Nov. 23, 2015, 4 Pages.

Mori, R., et al., "Performance and Construction of Polar Codes on Symmetric Binary—Input Memoryless Channels", arXiv:0901.2207v2, [cs.IT], May 23, 2009, 5 Pages.

Pedarsani, R., "Master Project Polar Codes: Construction and Performance Analysis", Information Theory Laboratory (LTHI), School of Computer and Communication Sciences (IC), Swiss Federal Institute of Technology (EPFL), Jun. 2011, 48 Pages.

Tal, I., et al., "List Decoding of Polar Codes", arXiv:1206.0050v1, [cs.IT], May 31, 2012, 11 Pages.

* cited by examiner

| CHANNEL | μ0 | μ1 | μ2 | μ3 | μ4 | μ5 | μ6 | μ7 | μ8 | μ9 | μ10 | μ11 | μ12 | μ13 | μ14 | μ15 |
|---|---|---|---|---|---|---|---|---|---|---|---|---|---|---|---|---|
| RELIABILITY | 0 | 1 | 1.1892 | 2.1892 | 1.4142 | 2.4142 | 2.6034 | 3.6034 | 1.6818 | 2.6818 | 2.871 | 3.871 | 3.096 | 4.096 | 4.2852 | 5.2852 |

FIG. 5A

| CHANNEL | μ0 | μ1 | μ2 | μ4 | μ8 | μ3 | μ5 | μ6 | μ7 | μ9 | μ10 | μ12 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 3.6034 | 2.6818 | 2.871 | 3.096 | 3.871 | 4.096 | 4.2852 | 5.2852 |

FIG. 5B

| CHANNEL | μ0 | μ1 | μ2 | μ4 | μ8 | μ3 | μ5 | μ6 | μ9 | μ10 | μ12 | μ7 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 2.6818 | 2.871 | 3.096 | 3.6034 | 3.871 | 4.096 | 4.2852 | 5.2852 |
| BINARY REPRESENTATION OF CHANNEL | 0 | 1 | 10 | 100 | 1000 | 11 | 101 | 110 | 1001 | 1010 | 1100 | 111 | 1011 | 1101 | 1110 | 1111 |
| HAMMING WEIGHT (hw) | 0 | 1 | 1 | 1 | 1 | 2 | 2 | 2 | 2 | 2 | 2 | 3 | 3 | 3 | 3 | 4 |
| ROW WEIGHT (rw) | 1 | 2 | 2 | 2 | 2 | 4 | 4 | 4 | 4 | 4 | 4 | 8 | 8 | 8 | 8 | 16 |

| CHANNEL | μ0 | μ1 | μ2 | μ4 | μ8 | μ3 | μ5 | μ6 | μ9 | μ10 | μ12 | μ7 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 2.6818 | 2.871 | 3.096 | 3.6034 | 3.871 | 4.096 | 4.2852 | 5.2852 |
| BINARY REPRESENTATION OF CH. IND. | 0 | 1 | 10 | 100 | 1000 | 11 | 101 | 110 | 1001 | 1010 | 1100 | 111 | 1011 | 1101 | 1110 | 1111 |
| HAMMING WEIGHT (hw) | 0 | 1 | 1 | 1 | 1 | 2 | 2 | 2 | 2 | 2 | 2 | 3 | 3 | 3 | 3 | 4 |
| ROW WEIGHT (rw) | 1 | 2 | 2 | 2 | 2 | 4 | 4 | 4 | 4 | 4 | 4 | 8 | 8 | 8 | 8 | 16 |
| STATUS | | | | | | | | | | | RES FOR PC | | | | RES FOR PC | |

FIG. 5E

| CHANNEL | μ0 | μ1 | μ2 | μ4 | μ8 | μ3 | μ5 | μ6 | μ9 | μ10 | μ12 | μ7 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 2.6818 | 2.871 | 3.096 | 3.6034 | 3.871 | 4.096 | 4.2852 | 5.2852 |
| BINARY REPRESENTATION OF CH. IND. | 0 | 1 | 10 | 100 | 1000 | 11 | 101 | 110 | 1001 | 1010 | 1100 | 111 | 1011 | 1101 | 1110 | 1111 |
| HAMMING WEIGHT (hw) | 0 | 1 | 1 | 1 | 1 | 2 | 2 | 2 | 2 | 2 | 2 | 3 | 3 | 3 | 3 | 4 |
| ROW WEIGHT (rw) | 1 | 2 | 2 | 2 | 2 | 4 | 4 | 4 | 4 | 4 | 4 | 8 | 8 | 8 | 8 | 16 |
| STATUS | | | | | | | | | | | RES FOR PC | 1 BIT | 1 BIT | 1 BIT | RES FOR PC | 1 BIT |

FIG. 5F

| CHANNEL | μ0 | μ1 | μ2 | μ4 | μ8 | μ3 | μ5 | μ6 | μ9 | μ10 | μ12 | μ7 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 2.6818 | 2.871 | 3.096 | 3.6034 | 3.871 | 4.096 | 4.2852 | 5.2852 |
| BINARY REPRESENTATION OF CH. IND. | 0 | 1 | 10 | 100 | 1000 | 11 | 101 | 110 | 1001 | 1010 | 1100 | 111 | 1011 | 1101 | 1110 | 1111 |
| HAMMING WEIGHT (hw) | 0 | 1 | 1 | 1 | 1 | 2 | 2 | 2 | 2 | 2 | 2 | 3 | 3 | 3 | 3 | 4 |
| ROW WEIGHT (rw) | 1 | 2 | 2 | 2 | 2 | 4 | 4 | 4 | 4 | 4 | 4 | 8 | 8 | 8 | 8 | 16 |
| STATUS | FROZEN | FROZEN | FROZEN | FROZEN | FROZEN | PC | PC | PC | PC | PC | PC | 1 BIT | 1 BIT | 1 BIT | PC | 1 BIT |

FIG. 5G

| CHANNEL | μ0 | μ1 | μ2 | μ4 | μ8 | μ3 | μ5 | μ6 | μ9 | μ10 | μ12 | μ7 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 2.6818 | 2.871 | 3.096 | 3.6034 | 3.871 | 4.096 | 4.2852 | 5.2852 |
| BINARY REPRESENTATION OF CH. IND. | 0 | 1 | 10 | 100 | 1000 | 11 | 101 | 110 | 1001 | 1010 | 1100 | 111 | 1011 | 1101 | 1110 | 1111 |
| HAMMING WEIGHT (hw) | 0 | 1 | 1 | 1 | 1 | 2 | 2 | 2 | 2 | 2 | 2 | 3 | 3 | 3 | 3 | 4 |
| ROW WEIGHT (rw) | 1 | 2 | 2 | 2 | 2 | 4 | 4 | 4 | 4 | 4 | 4 | 8 | 8 | 8 | 8 | 16 |
| STATUS | FROZEN | FROZEN | FROZEN | FROZEN | FROZEN | PC | PC | PC | PC | PC | PC | 1 BIT | 1 BIT | 1 BIT | PC | 1 BIT |

| CHANNEL | μ0 | μ1 | μ2 | μ3 | μ4 | μ5 | μ6 | μ7 | μ8 | μ9 | μ10 | μ11 | μ12 | μ13 | μ14 | μ15 |
|---|---|---|---|---|---|---|---|---|---|---|---|---|---|---|---|---|
| RELIABILITY | 0 | 1 | 1.1892 | 2.1892 | 1.4142 | 2.4142 | 2.6034 | 3.6034 | 1.6818 | 2.6818 | 2.871 | 3.871 | 3.096 | 4.096 | 4.2852 | 5.2852 |

FIG. 6A

| CHANNEL | μ0 | μ1 | μ2 | μ4 | μ8 | μ3 | μ5 | μ6 | μ7 | μ9 | μ10 | μ12 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 3.6034 | 2.6818 | 2.871 | 3.096 | 3.871 | 4.096 | 4.2852 | 5.2852 |

FIG. 6B

| CHANNEL | μ0 | μ1 | μ2 | μ4 | μ8 | μ3 | μ5 | μ6 | μ7 | μ9 | μ10 | μ12 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 3.6034 | 2.6818 | 2.871 | 3.096 | 3.871 | 4.096 | 4.2852 | 5.2852 |
| BINARY REPRESENTATION OF CH. IMD. | 0 | 1 | 10 | 100 | 1000 | 11 | 101 | 110 | 111 | 1001 | 1010 | 1100 | 1011 | 1101 | 1110 | 1111 |
| HAMMING WEIGHT (hw) | 0 | 1 | 1 | 1 | 1 | 2 | 2 | 2 | 3 | 2 | 2 | 2 | 3 | 3 | 3 | 4 |

FIG. 6C

| CHANNEL | μ0 | μ1 | μ2 | μ4 | μ8 | μ3 | μ5 | μ6 | μ9 | μ10 | μ12 | μ7 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 2.6818 | 2.871 | 3.096 | 3.6034 | 3.871 | 4.096 | 4.2852 | 5.2852 |
| BINARY REPRESENTATION OF CH. IND. | 0 | 1 | 10 | 100 | 1000 | 11 | 101 | 110 | 1001 | 1010 | 1100 | 111 | 1011 | 1101 | 1110 | 1111 |
| HAMMING WEIGHT (hw) | 0 | 1 | 1 | 1 | 1 | 2 | 2 | 2 | 2 | 2 | 2 | 3 | 3 | 3 | 3 | 4 |
| STATUS | | | | | | | | | | | RES FOR PC | | | | RES FOR PC | |

FIG. 6D

| CHANNEL | μ0 | μ1 | μ2 | μ4 | μ8 | μ3 | μ5 | μ6 | μ9 | μ10 | μ12 | μ7 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 2.6818 | 2.871 | 3.096 | 3.6034 | 3.871 | 4.096 | 4.2852 | 5.2852 |
| BINARY REPRESENTATION OF CH. IND. | 0 | 1 | 10 | 100 | 1000 | 11 | 101 | 110 | 1001 | 1010 | 1100 | 111 | 1011 | 1101 | 1110 | 1111 |
| HAMMING WEIGHT (hw) | 0 | 1 | 1 | 1 | 1 | 2 | 2 | 2 | 2 | 2 | 2 | 3 | 3 | 3 | 3 | 4 |
| STATUS | | | | | | | | | | | RES FOR PC | 1 BIT | 1 BIT | 1 BIT | RES FOR PC | 1 BIT |

FIG. 6E

| CHANNEL | μ0 | μ1 | μ2 | μ4 | μ8 | μ3 | μ5 | μ6 | μ9 | μ10 | μ12 | μ7 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 2.6818 | 2.871 | 3.096 | 3.6034 | 3.871 | 4.096 | 4.2852 | 5.2852 |
| BINARY REPRESENTATION OF CHANNEL | 0 | 1 | 10 | 100 | 1000 | 11 | 101 | 110 | 1001 | 1010 | 1100 | 111 | 1011 | 1101 | 1110 | 1111 |
| HAMMING WEIGHT (hw) | 0 | 1 | 1 | 1 | 1 | 2 | 2 | 2 | 2 | 2 | 2 | 3 | 3 | 3 | 3 | 4 |
| STATUS | FROZEN | FROZEN | FROZEN | FROZEN | FROZEN | FROZEN | FROZEN | FROZEN | FROZEN | FROZEN | RES FOR PC | 1 BIT | 1 BIT | 1 BIT | RES FOR PC | 1 BIT |

FIG. 6F

| CHANNEL | μ0 | μ1 | μ2 | μ4 | μ8 | μ3 | μ5 | μ6 | μ9 | μ10 | μ12 | μ7 | μ11 | μ13 | μ14 | μ15 |
|---|---|---|---|---|---|---|---|---|---|---|---|---|---|---|---|---|
| RELIABILITY | 0 | 1 | 1.1892 | 1.4142 | 1.6818 | 2.1892 | 2.4142 | 2.6034 | 2.6818 | 2.871 | 3.096 | 3.6034 | 3.871 | 4.096 | 4.2852 | 5.2852 |
| BINARY REPRESENTATION OF CHANNEL | 0 | 1 | 10 | 100 | 1000 | 11 | 101 | 110 | 1001 | 1010 | 1100 | 111 | 1011 | 1101 | 1110 | 1111 |
| HAMMING WEIGHT (hw) | 0 | 1 | 1 | 1 | 1 | 2 | 2 | 2 | 2 | 2 | 2 | 3 | 3 | 3 | 3 | 4 |
| STATUS | FROZEN | FROZEN | FROZEN | FROZEN | FROZEN | PC | PC | PC | PC | PC | PC | 1 BIT | 1 BIT | 1 BIT | PC | 1 BIT |

FIG. 6G

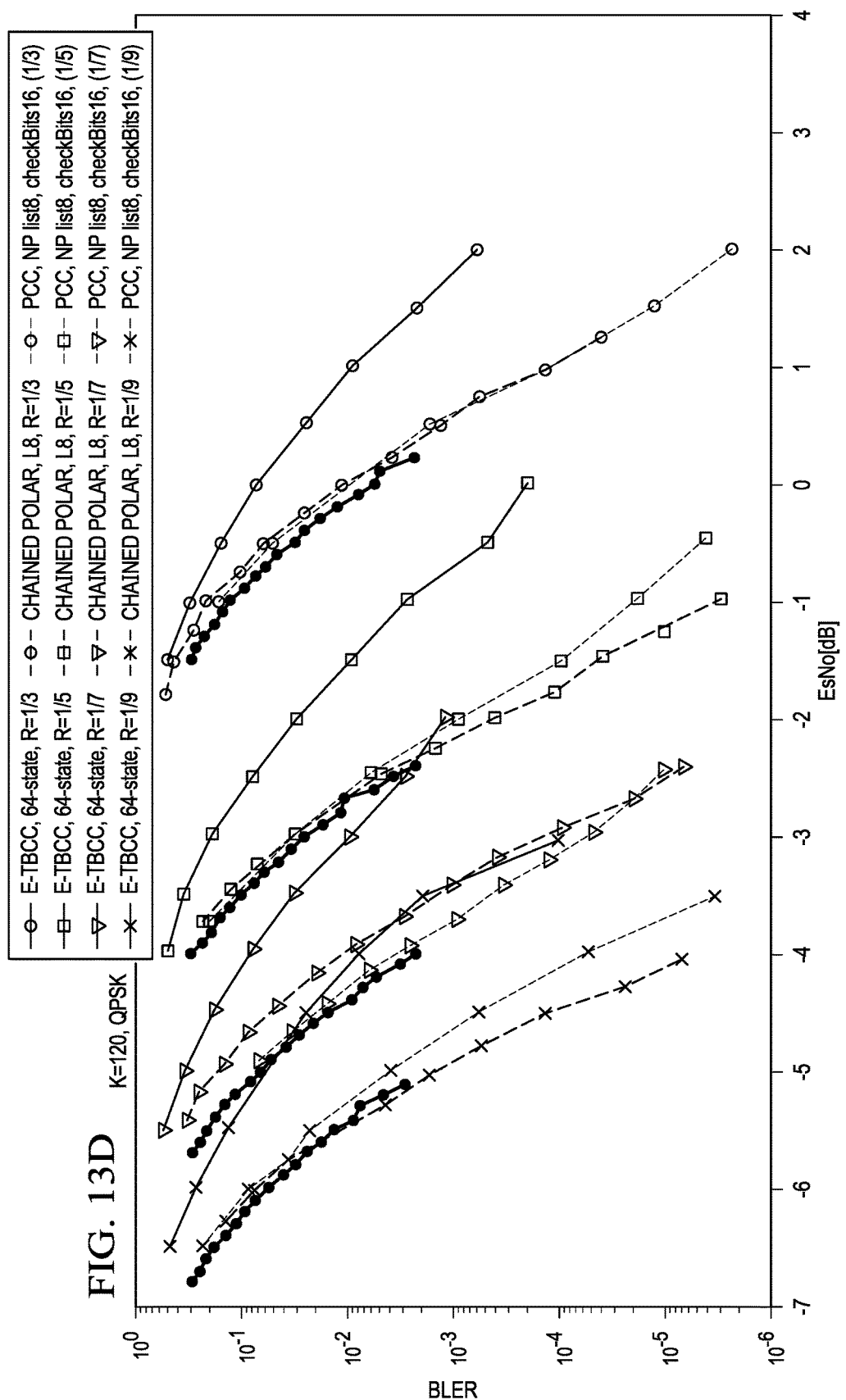
FIG. 13D  K=120, QPSK

METHOD AND APPARATUS FOR ENCODING DATA USING A POLAR CODE

This patent application claims priority to U.S. Provisional Patent Application 62/395,312 filed on Sep. 15, 2016 and entitled "Method and device for assigning dynamic frozen bits and constructing a Parity Function on them in a Polar code," U.S. Provisional Patent Application 62/396,618 filed on Sep. 19, 2016 and entitled "Method and device for assigning dynamic frozen bits and constructing a Parity Function on them in a Polar code," U.S. Provisional Patent Application 62/402,862 filed on Sep. 19, 2016 and entitled "Method and Device For Parallel Polar Code Encoding/Decoding," U.S. Provisional Patent Application 62/432,448 filed on Dec. 9, 2016 and entitled "Method for Constructing a Parity Check (Pc) Based Polar Code Using a Look-Up-Table," U.S. Provisional Patent Application 62/432,416 filed on Dec. 9, 2016 and entitled "Method and system to parallelize parity check (PC)-Polar-Construction," and U.S. Provisional Patent Application 62/433,127 filed on Dec. 12, 2016 and entitled "Method for Constructing a parity check (PC) based Polar Code using a Look-up-Table," all of which are incorporated herein by reference as if reproduced in their entireties.

TECHNICAL FIELD

The present invention relates generally to a method and apparatus for data transmission, and in particular, a method and apparatus for encoding.

BACKGROUND

Polar codes are linear block error correcting codes that exploit channel polarization to improve overall transmission capacity. In particular, polar codes are designed to transmit information bits over more-reliable sub-channels (e.g., less noisy sub-channels), while transmitting fixed (or frozen) bits over less-reliable sub-channels (e.g., noisier sub-channels). Polar encoding is described in greater detail by the academic paper entitled "Channel Polarization and Polar codes," which is incorporated herein by reference as if reproduced in its entirety.

SUMMARY

Technical advantages are generally achieved, by embodiments of this disclosure which describe a method and apparatus for polarization encoding.

In accordance with an embodiment, a method for encoding data with a polar code is provided. In this embodiment, the method includes polar encoding information bits and at least one parity bit to obtain encoded data with an encoder of a device. The at least one parity bit is placed in at least one sub-channel selected for the at least one parity bit based on a weight parameter. The method further includes transmitting the encoded data to another device. In one example, the weight parameter comprises a minimal weight. In such an example, the at least one parity bit may be placed in at least one of a first number of sub-channels with a minimal weight or in a second number of sub-channels with twice the minimal weight. In that same example, or in another example, the method may further include selecting, from a segment of ordered sub-channels, the at least one sub-channel with a minimal weight. The at least one sub-channel with a minimal weight may be selected from a segment of K sub-channels of the ordered sub-channels, each of the K sub-channels having a higher reliability metric than sub-channels of a N0–K segment of the ordered sub-channels, where K is an information block length and N0 is a mother code length. In that same example, or another example, the segment of ordered sub-channels, the at least one sub-channel with a minimal weight comprises if a number n of sub-channels with a minimal weight in the segment of K sub-channels is greater than a predetermined value F, selecting from the segment of K sub-channels, F sub-channels with a minimal weight in a descending order of the reliability metric. In that example, or in another example, the encoder may apply a parity check function to determine a value for each of the at least one parity bit. In such an example, the parity check function may be a prime number parity check function. In any of the aforementioned example, or in another example, the method further includes the ordered sub-channels are ordered based on a reliability metric. In any of the aforementioned examples, or in another example, the weight parameter may comprise a lowest row-weight. The method may further comprise selecting at least one sub-channel with a lowest row-weight in a subset of K most reliable sub-channels of an ordered sequence of sub-channels, where a row-weight of a sub-channel is a number of ones in a row of a Kronecker matrix, and the row corresponding to the sub-channel. In such an example, selecting the at least one sub-channel with a lowest row-weight in the subset of K most reliable sub-channels may include selecting $F_p$ sub-channels with the lowest row-weight in the subset of K most reliable sub-channels if a number of sub-channels with the lowest row-weight amongst the K most reliable sub-channels is greater than a predetermined number $F_p$. In that same example, or another example, the at least one sub-channel with a lowest row-weight may be selected from the subset of K most reliable sub-channels according to a descending reliability order. In that same example, or another example, the method may further include selecting sub-channels for the information bits in the ordered sequence of sub-channels, skipping the at least one sub-channel selected for the at least one parity bit, until a number of the sub-channels selected for the information bits reaches K. An apparatus for performing this method is also provided.

In accordance with yet another embodiment, a device configured to encode data with a polar code is provided. In this embodiment, the device includes an encoder configured to polar encode information bits and at least one parity bit to obtain encoded data. The at least one parity bit is placed in at least one sub-channel selected for the at least one parity bit based on a weight parameter and an interface configured to transmit the encoded data to another device. In one example, the weight parameter comprises a minimal weight. In such an example, the at least one parity bit may be placed in at least one of a first number of sub-channels with a minimal weight or in a second number of sub-channels with twice the minimal weight. In that same example, or another example, the encoder may be further configured to select, from a segment of ordered sub-channels, the at least one sub-channel with a minimal weight. In that same example, or another example, the at least one sub-channel with a minimal weight may be selected from a segment of K sub-channels of the ordered sub-channels, each of the K sub-channels having a higher reliability metric than sub-channels of a $N_0$–K segment of the ordered sub-channels, where K is an information block length and $N_0$ is a mother code length. In that same example, or another example, the device/encoder may select, from the segment of ordered sub-channels, the at least one sub-channel with a minimal weight, and select from the segment of K sub-channels, F sub-channels with a minimal weight in a descending order of the reliability metric if a number of sub-channels with a minimal weight in the segment of K sub-channels is greater than a predetermined value F. In that example, or in another example, the encoder may be further configured to apply a parity check function to determine a value for each of the at least one parity bit. In such an example, the parity check function may be a prime number parity check function. In any of the aforementioned examples, or in another example, the device ordered sub-channels may be ordered based on a reliability metric. In any of the aforementioned examples, or in another example, the weight parameter may include a lowest row-weight, and the encoder may be further configured to select at least one sub-channel with a lowest row-weight in a subset of K most reliable sub-channels of an ordered sequence of sub-channels. A row-weight of a sub-channel is a number of ones in a row of a Kronecker matrix. The row may correspond to the sub-channel. In such an example, the device may select at least one sub-channel with a lowest row-weight in the subset of K most reliable sub-channels. The encoder may be further configured to select $F_p$ sub-channels with the lowest row-weight in the subset of K most reliable sub-channels when a number n of sub-channels with the lowest row-weight amongst the K most reliable sub-channels is greater than a predetermined number $F_p$. In that same example, or another example, at least one sub-channel with a lowest row-weight may be selected from the subset of K most reliable sub-channels according to a descending reliability order. In that same example, or another example, the encoder may be further configured to select sub-channels for the information bits in the ordered sequence of sub-channels, skipping the at least one sub-channel selected for the at least one parity bit, until a number of the sub-channels selected for the information bits reaches K.

In accordance with an embodiment, another method for encoding data is provided. In this embodiment, the method includes allocating one or more sub-channels for one or more parity bits based on row weights for sub-channels in a subset of a set of sub-channels and mapping information bits to remaining sub-channels in the set of sub-channels based on a reliability of the remaining sub-channels without mapping the information bits to the one or more sub-channels allocated for the one or more parity bits. The method may further include encoding the information bits and the one or more parity bits using a polar code to obtain an encoded bit stream and transmitting the encoded bit stream. In one example, the row weight for a sub-channel represents the number of ones in a row of a Kronecker matrix, with the row corresponding to the sub-channel. In that example, or in another example, the row weights may include at least a minimum row weight. In such an example, the method may include allocating one or more sub-channels for one or more parity bits based on row weights for sub-channels in a subset of a set of sub-channels, and allocating for the one or more parity bits, a number of sub-channels having a row weight equal to the minimum row weight in the subset of sub-channels. In that same example, or another example, the number of allocated sub-channels may be one and the sub-channels in the set may be ordered based on their reliabilities to form an ordered sequence of sub-channels, where the subset of sub-channels comprises a most reliable subset of sub-channels in the ordered sequence. In that same example, or another example, the most reliable subset of sub-channels may include K sub-channels for carrying the information bits. In that same example, or another example, the most reliable subset of sub-channels may comprise K+$F_p$ sub-channels, where K is an information block length associated with the information bits, and $F_p$ indicates a number of the one or more parity bits. In that same example, or another example, a most reliable sub-channel having a row weight equal to the minimum row weight in the subset of sub-channels may be allocated for the one or more parity bits. In any of the aforementioned examples, or in another example, the one or more parity bits may include one or more parity check (PC) bits. In such an example, encoding the information bits and the one or more PC bits using a polar code to obtain the encoded bit stream may comprise determining one or more values for the one or more PC bits as a function of values of the information bits and mapping the one or more PC bits to at least the one or more sub-channels allocated for the PC bits.

In accordance with yet another embodiment, a device for encoding data with a polar code is provided. In this embodiment, the device is configured to allocate one or more sub-channels for one or more parity bits based on row weights for sub-channels in a subset of a set of sub-channels and to map information bits to remaining sub-channels in the set of sub-channels based on a reliability of the remaining sub-channels without mapping the information bits to the one or more sub-channels allocated for the one or more parity bits. The device is further configured to encode the information bits and the one or more parity bits using a polar code to obtain an encoded bit stream; and transmit the encoded bit stream. In one example, the row weight for a sub-channel represents the number of ones in a row of a Kronecker matrix, the row corresponding to the sub-channel. In that example, or in another example, the row weights comprise at least a minimum row weight. In such an example, or in another example, the device may allocate one or more sub-channels for one or more parity bits based on row weights for sub-channels in a subset of a set of sub-channels. The device may be further configured to allocate, for the one or more parity bits, a number of sub-channels having a row weight equal to the minimum row weight in the subset of sub-channels. In any of the aforementioned examples, or in another example, the number of allocated sub-channels may be one and the sub-channels in the set may be ordered based on their reliabilities to form an ordered sequence of sub-channels, where the subset of sub-channels comprises a most reliable subset of sub-channels in the ordered sequence. In any of the aforementioned examples, or in another example, the most reliable subset of sub-channels may include K sub-channels for carrying the information bits and the most reliable subset of sub-channels comprises K+$F_p$ sub-channels, where K is an information block length associated with the information bits, and $F_p$ indicates a number of the one or more parity bits. In that same example, or another example, a most reliable sub-channel having a row weight equal to the minimum row weight in the subset of sub-channels is allocated for the one or more parity bits. In that same example, or another example, the one or more parity bits include one or more parity check (PC) bits.

In accordance with yet another embodiment, a decoding method for a device is provided. In this embodiment, the method includes receiving from another device, a signal based on encoded data, the encoded data produced by encoding with a polar code, information bits and at least one parity bit. In this embodiment, the at least one parity bit is placed in at least one sub-channel selected based on a weight parameter. The method also includes with a decoder of the device, decoding the signal using the polar code and the at least one parity bit to obtain the information bits.

In one example, the weight parameter includes a minimal weight. In such an example, the at least one parity bit may be placed in at least one of a first number of sub-channels with a minimal weight or in a second number of sub-channels with twice the minimal weight. In that same example, or in another example, the at least one sub-channel selected has a minimal weight and the at least one sub-channel is selected from a segment of ordered sub-channels. The at least one sub-channel with a minimal weight may be selected from a segment of K sub-channels of the ordered sub-channels where each of the K sub-channels having a higher reliability metric than sub-channels of a N0–K segment of the ordered sub-channels, and where K is an information block length and N0 is a mother code length. In that example, or in another example, a value of each of the at least one parity bit is based on a parity check function. In such an example, the parity check function may be a prime number parity check function. In any of the aforementioned example, or in another example, the ordered sub-channels are ordered based on a reliability metric. In any of the aforementioned examples, or in another example, the weight parameter may comprise a lowest row-weight and the at least one sub-channel selected has a lowest row-weight in a subset of K most reliable sub-channels of an ordered sequence of sub-channels, where a row-weight of a sub-channel is a number of ones in a row of a Kronecker matrix, and the row corresponding to the sub-channel. In such an example. In that same example, or another example, the at least one sub-channel with a lowest row-weight is selected from the subset of K most reliable sub-channels according to a descending reliability order. In that same example, or another example, sub-channels for the information bits are selected in the ordered sequence of sub-channels by skipping the at least one sub-channel selected for the at least one parity bit, until a number of the sub-channels selected for the information bits reaches K. An apparatus for performing this method is also provided.

In accordance with yet another embodiment, a decoding method for a device is provided. In this embodiment, the method includes receiving from another device, a signal based on an encoded bit stream where the encoded bit stream is produced by encoding with a polar code, information bits and one or more parity bits. The one or more parity bits are mapped to one or more sub-channels allocated based on row weights for sub-channels in a subset of a set of sub-channels, and the information bits are mapped to remaining sub-channels in the set of sub-channels based on a reliability of the remaining sub-channels. The method also includes decoding the signal using the polar code and the one or more parity bits to obtain the information bits.

In one example, the row weight for a sub-channel represents the number of ones in a row of a Kronecker matrix, with the row corresponding to the sub-channel. In that example, or in another example, the row weights may include at least a minimum row weight. In such an example, one or more sub-channels are allocated for the one or more parity bits based on row weights for sub-channels in a subset of a set of sub-channels. In another example, a number of sub-channels having a row weight equal to the minimum row weight in the subset of sub-channels is allocated for the one or more parity bits. In that same example, or another example, the number of allocated sub-channels may be one and the sub-channels in the set may be ordered based on their reliabilities to form an ordered sequence of sub-channels, where the subset of sub-channels comprises a most reliable subset of sub-channels in the ordered sequence. In that same example, or another example, the most reliable subset of sub-channels may include K sub-channels for carrying the information bits. In that same example, or another example, the most reliable subset of sub-channels may comprise $K+F_p$ sub-channels, where K is an information block length associated with the information bits, and $F_p$ indicates a number of the one or more parity bits. In that same example, or another example, a most reliable sub-channel having a row weight equal to the minimum row weight in the subset of sub-channels may be allocated for the one or more parity bits. In any of the aforementioned examples, or in another example, the one or more parity bits may include one or more parity check (PC) bits. In such an example or another example, one or more values for the one or more PC bits are a function of values of the information bits.

BRIEF DESCRIPTION OF THE DRAWINGS

For a more complete understanding of the present disclosure, and the advantages thereof, reference is now made to the following description taken in conjunction with the accompanying drawings, in which:

FIGS. 5A-5G are tables explaining how row weights are computed and used to select candidate sub-channels to reserve for parity check (PC) bits;

FIGS. 6A-6G are tables explaining how hamming weights are used to select candidate sub-channels to reserve for parity check (PC) bits;

FIGS. 13A-13D are graphs of block error rates (BLERs) achieved by different polar codes;

DETAILED DESCRIPTION OF ILLUSTRATIVE EMBODIMENTS

Figures 1, 2:
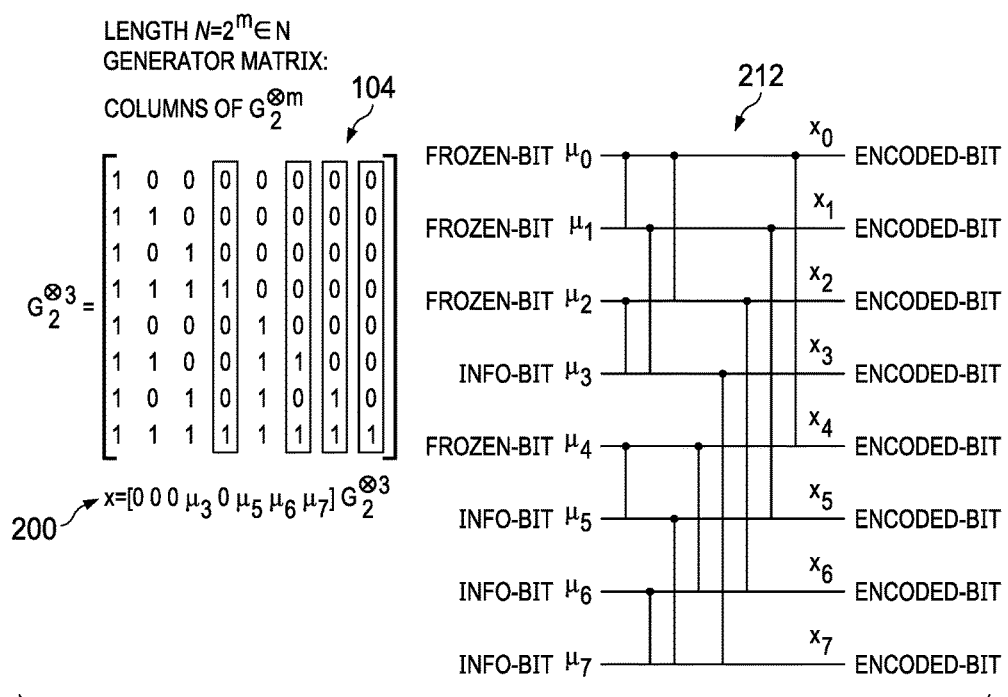
FIG. 1 is a diagram showing one example of how a polar coding generator matrix can be produced from a kernel.
FIG. 2 is a diagram showing an example use of a polar coding generator matrix for producing codewords and a schematic illustration of an example polar encoder.

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the invention, and do not limit the scope of the invention.

Parity bits may be added to a string of information bits during polar encoding to assist in decoding and facilitate error detection or correction at the receiver. The terms "parity check (PC) bits", "parity bits", and dynamic frozen bits are used interchangeably throughout this disclosure. Although much of this disclosure discusses inventive embodiments in the context of parity bits, it should be appreciated that parity bits are a particular type of assistant bit, and that the principles disclosed herein may be applied using other types of assistant bits, such as other error correction bits, or codes like Cyclic Redundancy Check (CRC) bits, checksums bits, hash function bits, cryptographic codes, repetition codes, or error detection bits or codes. In some embodiments, party bits are referred to as parity check (PC) frozen bits (or "PF bits" for short).

One issue that arises when inserting (P) parity bits during polar encoding is how to select the sub-channel(s) (amongst N sub-channels) over which to transmit the parity bits. One option for handling parity bits during polar encoding is to map the (K) information bits to be encoded (which may also include other assistant bits) to the most-reliable sub-channels, and then to map the parity bit(s) to the next-most reliable sub-channel(s) that are available after mapping the information bits to the most-reliable sub-channels. Another option is to map the parity bit(s) to the most reliable sub-channel(s), and then to map the information bits to the next-most reliable sub-channels that are available after mapping the parity bit(s) to the most-reliable sub-channels.

Simulations have shown that those two options generally provide lower levels of performance than embodiment techniques that map the parity bits to sub-channels based on their row weights. The row weight for a sub-channel may be viewed as the number of "ones" in the corresponding row of the Kronecker matrix or as a power of 2 with the exponent (i.e. the hamming weight) being the number of "ones" in the binary representation of the sub-channel index (further described below). In one embodiment, candidate sub-channels that have certain row weight values (e.g. a minimum row weight–$w_{min}$ or twice the minimum row weight $2*w_{min}$) are set aside and used for parity bit(s). The candidate sub-channels that are reserved for the parity bit(s) are not necessarily the most reliable sub-channels, as can be appreciated based on the descriptions for computing the row weights provided below. After the candidate sub-channels are identified, the K information bits are mapped to the K most reliable remaining sub-channels, and a number of frozen bits (e.g. N–K) are mapped to the least reliable remaining sub-channels. Parity bits are mapped to the candidate sub-channels and parity bit values are determined based on a function of the information bits.

There are many ways to determine the row weight for a sub-channel. In one embodiment, the row weight may be computed as a function of the hamming weight of a channel index associated with the sub-channel. The hamming weight is the number of non-zero elements in a binary sequence representing the channel index. In one example, the sub-channels (N) are sorted into an ordered sequence (Q) based on their channel reliabilities such that the ordered sequence (Q) lists the sub-channels in ascending order ($Q_0, Q_1, \ldots Q_N$) based on their reliability (where $Q_N$ is the most reliable sub-channel). A minimum row weight value, denoted interchangeably in throughout this disclosure as $w_{min}$ or $d_{min}$, may then be identified based on the row weights of a subset of the most reliable channels such as, for example, the most reliable K subset used for K information bits (e.g. $Q_{(N-K+1)} \ldots Q_N$) or the most reliable (K+P) subset used for K information bits and P parity bits (e.g. $Q_{(N-K-P)} \ldots Q_N$). The minimum row weight value in that most reliable subset may then be used to reserve sub-channels for the parity bits.

In some embodiments, if the process of dynamically calculating the $w_{min}$ parameter adds latency to the encoding operation, a look up table (LUT) can be employed to identify the $w_{min}$ parameter.

In particular, the LUT-based techniques generate the look up table offline by computing possible $w_{min}$ parameters as a function of potential combinations of information block lengths (K) and mother code lengths (M) that may be used during polar encoding. The look up table is then used to determine the $w_{min}$ parameter during online polar encoding. Table 1 provides an example of a look up table that can be used to determine the code parameters, which includes the $w_{min}$ parameter, and indices ($f_1, f_2$) used to determine the number of candidate sub-channels that are to be reserved for parity bits (further details below).

TABLE 1

| $w_{min}, f_1, f_2$ | K = 100 | K = 400 | K = 1000 | K = 2000 | K = 4000 | K = 6000 | K = 8000 |
|---|---|---|---|---|---|---|---|
| K/M = 1/5 | 32, 12, 0 | 32, 5, 7 | 32, 2, 11 | 32, 1, 13 | 64, 20, 0 | 64, 20, 0 | 64, 21, 0 |
| K/M = 1/3 | 32, 13, 0 | 16, 4, 9 | 16, 1, 13 | 32, 19, 0 | 32, 21, 0 | 32, 17, 4 | 32, 15, 5 |
| K/M = 2/5 | 8, 1, 8 | 16, 10, 4 | 16, 5, 10 | 16, 3, 13 | 16, 2, 14 | 16, 1, 15 | 16, 1, 16 |
| K/M = 1/2 | 8, 10, 1 | 8, 1, 10 | 16, 17, 0 | 16, 14, 3 | 16, 9, 8 | 16, 7, 10 | 16, 6, 11 |
| K/M = 2/3 | 4, 3, 7 | 8, 15, 0 | 8, 7, 7 | 8, 5, 10 | 8, 3, 12 | 8, 2, 14 | 8, 2, 14 |
| K/M = 3/4 | 4, 11, 0 | 4, 1, 10 | 8, 15, 0 | 8, 17, 0 | 8, 16, 1 | 8, 7, 8 | 8, 11, 7 |
| K/M = 5/6 | 2, 1, 6 | 4, 5, 5 | 4, 4, 7 | 4, 2, 10 | 4, 1, 12 | 4, 1, 12 | 8, 18, 0 |
| K/M = 8/9 | 2, 2, 4 | 4, 11, 0 | 4, 12, 1 | 4, 8, 4 | 4, 4, 9 | 4, 3, 10 | 4, 3, 10 |

The time required to identify the $w_{min}$ parameter during online polar encoding is heavily influenced by the size of the look up table, as larger tables typically require longer search times. As a result, the latency requirements of the encoder may constrain the granularity of encoding combinations that are available in the look up table, thereby impacting coding performance.

Other embodiments of this disclosure provide low-latency techniques that reserve or allocate sub-channels for parity bits based on a minimum hamming weight ($u_{min}$) parameter, thereby circumventing computation of the row weights. As discussed above, row weights may be computed as a function of the hamming weights. In one example, based on the equation: $rw=2^{hw}$, where rw is the row weight for the given sub-channel, and hw is the hamming weight of a binary representation of the channel index for the given sub-channel. The symbols "hw" and "u" are used interchangeably herein to refer to a hamming weight. From this, it is clear that the sub-channel associated with the lowest hamming weight will also have the lowest row weight. Thus, it is possible to identify the minimum hamming weight ($u_{min}$) based on hamming weights associated with sub-channels in a subset of most reliable channels (e.g., $Q_{(N-(K+F_p))} \ldots, Q_N$), and then use the minimum hamming weight to reserve sub-channels for parity bits.

As discussed below, twice the minimum row weight value ($2*w_{min}$) is sometimes used, in conjunction with $w_{min}$, to reserve sub-channels for parity bits. For example, a first number (e.g. $f_1$) of most reliable sub-channels having a row weight equal to $w_{min}$ may be reserved for parity bits, and a second number (e.g. $f_2$) of most reliable sub-channels having a row weight equal to $2*w_{min}$ may be reserved for parity bits. From the equation: $rw=2^{hw}$, it is clear that $2*w_{min}$ parameter corresponds to one plus the minimum hamming weight. Thus, embodiments of this disclosure may reserve a first number of most reliable sub-channels having a hamming weight equal to the minimum hamming weight for parity bits, and a second number of most reliable sub-channels having a hamming weight equal to one plus the minimum hamming weight for parity bits.

A brief discussion of polar coding is provided below to assist in understanding these and other inventive aspects of the present disclosure which will be described subsequently in greater detail below. FIG. 1 is a diagram showing, by way of an illustrative example, how a polar coding generator matrix can be produced from a kernel $G_2$ 100. Note that FIG. 1 is an example. Other forms of kernel are also possible. Polarization comes from the "nested" way in which a generator matrix is created from a kernel (or combination of kernels).

The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

A polar code can be formed from a Kronecker product matrix based on matrix $G_2$ 100. For a polar code having codewords of length $N=2^m$, the generator matrix is $G_2^{\otimes m}$. FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2^{\otimes 3}$ 104 as indicated at 200. The input vector u is composed of information bits and fixed or frozen bits. In the specific example shown in FIG. 2, N=8, so the input vector u is an 8-bit vector, and the codeword x is an 8-bit vector. The input vector has frozen bits in positions 0, 1, 2, and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other fixed bit values that are known to both an encoder and a decoder. For ease of description, all-zero frozen bits are considered herein, and may be generally preferred.

Figure 3:
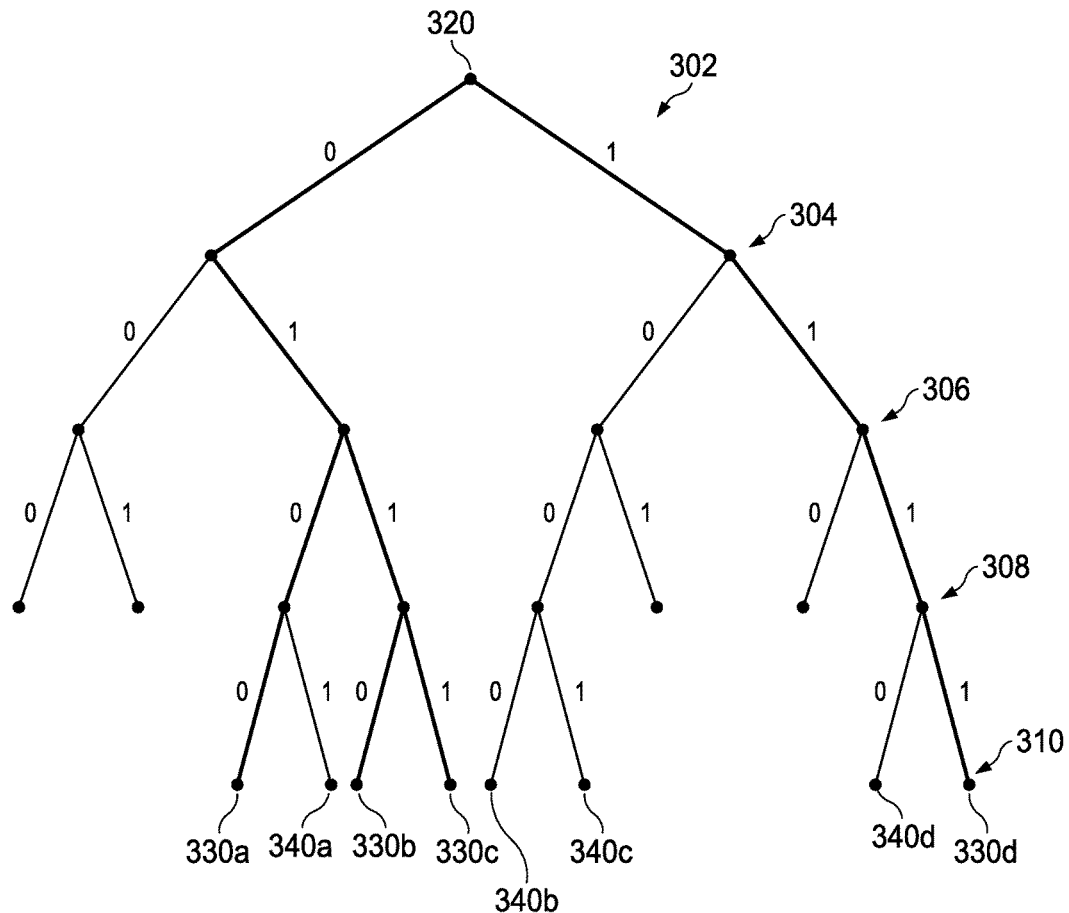
FIG. 3 is a diagram showing a portion of an example decision list tree whose width is limited by a maximum given list size and used in an SCL (Successive Cancellation List) polar decoder.

FIG. 3 is a diagram showing a portion of an example decision list tree whose width is limited by a maximum given list size and used in an SCL polar decoder. In FIG. 3 the list size L is 4. Five levels 302, 304, 306, 308, 310 of the decision tree are illustrated. Although five levels are illustrated, it should be understood that a decision tree to decode N bits would have N+1 levels. At each level after the root level 302, each one of up to 4 surviving decoding paths is extended by one bit. The leaf or child nodes of root node 320 represent possible choices for a first bit, and subsequent leaf nodes represent possible choices for subsequent bits. The decoding path from the root node 320 to leaf node 330a, for example, represents an estimated codeword bit sequence: 0, 1, 0, 0. At level 308, the number of possible paths is greater than L, so L paths having the highest likelihood (best path metrics or PMs) are identified, and the remaining paths are discarded. The decoding paths that survive after the path sort and prune at level 306 are shown in bold in FIG. 3. Similarly, at level 310, the number of possible paths is again greater than L, so the L paths having the highest likelihood (best PMs) are identified, and the remaining paths are again discarded. In the example shown, the paths terminating in leaf nodes 330a, 330b, 330c, and 330d represent the highest likelihood paths. The paths terminating in leaf nodes 340a, 340b, 340c, 340d are the lower likelihood paths which are discarded.

SCL decoding can be further divided into CRC-aided list decoding and pure list decoding. In the latter, survivor paths with the highest likelihood are selected. SC decoding is a special case of pure list decoding, with list size L=1. A CRC check may provide better error correction performance in the final path selection, but is optional in SCL decoding. Other operations such as a parity check based on parity or "PC" bits that are included in an input vector, could be used instead of and/or jointly with CRC in final path selection during decoding.

SCL decoding may improve the performance of a polar code for a limited code size. However, compared with the similar code length and code rates of Low Density Parity Check (LDPC) codes and Turbo codes, SCL decoding may have a worse Block Error Rate (BLER) than well-designed LDPC and Turbo codes. CRC-aided SCL (CA-SCL) decoding may improve the BLER performance of a polar code with a limited code length. For example, a CA-SCL decoder with a list size L=32 could provide for much better performance than LDPC and Turbo codes with similar computational complexity.

With SC-type decoders, a polar code in effect divides a channel into N sub-channels. N is referred to as mother code length and is always is power of 2 in an Arikan polar code, which is based on a polar kernel that is a 2-by-2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to PC, CRC, and/or other types of bits that are used to assist in decoding, referred to herein as assistant bits. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 4:
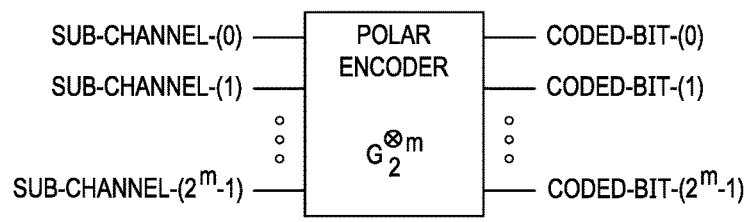
FIG. 4 is a block diagram illustrating an example of a polar encoder based on a 2-by-2 kernel.

Polar encoders based on Kronecker products of a 2-by-2 Arikan kernel $G_2$ are described above. FIG. 4 is a block diagram illustrating an example of a polar encoder based on a 2-by-2 kernel. Sub-channels and coded bits are labeled in FIG. 4, and a channel is divided into N sub-channels by a polar code as noted above. An information block and frozen bits are allocated onto the N sub-channels, and the resultant N-sized vector is multiplied with an N-by-N Kronecker matrix by the polar encoder to generate a codeword that includes N coded bits. An information block includes at least information bits and could also include assistant bits such as CRC bits or parity bits. A sub-channel selector could be coupled to the polar encoder to select at least sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels such as prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching or other purposes for example.

As a result of SC, SCL, or CA-SCL decoding, the polarization phenomenon appears over the sub-channels. Some sub-channels have high capacity, and some sub-channels have low capacity. Put another way, some sub-channels have equivalently high Signal-to-Noise Ratio (SNR) and others have low SNR. These metrics are examples of characteristics that could be used to quantify or classify sub-channel "reliability". Other metrics indicative of sub-channel reliability could also be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, parity bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

There are also several methods to compute sub-channel reliabilities. For example, according to a genie-aided method proposed in R. Pedarsani, "Polar Codes: Construction and Performance Analysis", June 2011, EPFL master project, an encoder encodes a training sequence that is known to the decoder on different sub-channels. The decoder feeds back decoding results to the encoder so that the encoder can compute reliability statistics for every sub-channel, and a well-adapted reliability-vector over the sub-channels is obtained.

A Gaussian-approximation (GA) method proposed in non-patent literature publication entitled "Evaluation and Optimization of Gaussian Approximation for Polar Codes", May 2016, assumes that every coded bit is subjected to an equal error probability. From the error probability, the reliabilities over the sub-channels are obtained with a density evolution (DE) algorithm. Because this error probability on the coded bits is related to the receiving SNR, this method is SNR-related and is computationally complex.

There are several ways to generate an ordered sequence from a kernel and its generator matrix. Not every way might necessarily lead to a nested sequence, and this nested sequence might not necessarily be unique. Nested ordered sequences could be generated, for example, based on a polarization weight as disclosed in Chinese Patent Application No. CN 201610619696.5, filed on Jul. 29, 2016, or based on a hamming weight as disclosed in U.S. Patent Application No. 62/438,565, filed on Dec. 23, 2016, both of which are entirely incorporated herein by reference. Other techniques could also or instead be used.

An example of how the hamming weight can be used as the second metric to select assistant sub-channels is discussed in more detail in U.S. Provisional application No. 62/433,127 filed on Dec. 12, 2016 which is incorporated by reference herein. Note that the hamming weight is just an example of a metric that could be used as a second metric. Other examples include a function of the hamming weight (e.g. row weights as disclosed in U.S. Provisional application No. 62/432,448 filed on Dec. 9, 2016 and incorporated by reference herein. Generally, any other metric also indicative of the (polarization) reliability can be used as the second metric. In a further alternative, the second metric is different from the first metric but also relates to or is indicative of the polarization reliability. However, in yet another alternative, the natural order of sub-channels can be used as the second metric so that, for instance, sub-channels at the end of the information sub-channels (e.g in a natural number ascending order) are selected as the assistant sub-channels.

In some embodiments, more than two metrics could be used for selecting assistant sub-channels. In addition, any of various assistant sub-channel selection algorithms using the above described metrics could be used. Other possibilities exist for selecting assistant sub-channels.

As mentioned above, in order to facilitate error correction or detection at the receiver and assist in decoding, assistant bits such as CRC or parity bits may be included into the input bit stream. One issue that arises when inserting assistant bits during polar encoding is how to select the sub-channel(s) over which to transmit the assistant bits. In particular, polar encoders generally map, or otherwise transmit, information bits to, or over, the most reliable sub-channels, while mapping, or otherwise transmitting, frozen bits to, or over, less-reliable sub-channels. When assistant bits are introduced into the encoded bit stream as well, the question becomes whether the most-reliable channels should be used for the parity bits or the information bits.

One option for handling parity bits during polar encoding is to map the information bits to the most-reliable sub-channels (e.g. based on an ordered sequence), and then to map the parity bit(s) to the next-most reliable sub-channel(s) that are available after mapping the information bits to the most-reliable sub-channels. In this way, information bits are transmitted over more reliable channels than parity bits. Another option is to map the parity bit(s) to the most reliable sub-channel(s), and then to map the information bits to the next-most reliable sub-channels that are available after mapping the parity bit(s) to the most-reliable sub-channels. In this way, parity bits are transmitted over more reliable channels than information bits.

Simulations have shown that higher levels of encoding performance can actually be achieved by a hybrid approach in which the parity bits and information bits are interspersed over the most-reliable channels. While the selection of sub-channels for information bits could be based on sub-channel polarization reliability (e.g. as indicated by an ordered sequence), the selection of the sub-channels for parity bits could be based on more than a polarization reliability metric, for example, to enable the positions of these parity sub-channels to be distributed more randomly or more efficiently among the information sub-channels.

In some embodiments, two different metrics are used for parity or PC sub-channel selection. For example, a first metric can be a polarization reliability metric (e.g. an ordered sequence) and a second metric can be a weight such as a hamming weight of the sub-channels (or a function of the hamming weight such as a row weight). In one embodiment, all the sub-channels necessary to carry the desired number of parity bits are selected based on more than one metric, e.g., a polarization reliability metric and a hamming/row weight; while in other embodiments, a subset of the sub-channels for parity bits is selected based on more than one metric, e.g., a polarization reliability metric and a hamming/row weight, and a remaining subset is selected based on a single metric, e.g., a polarization reliability metric.

A hamming weight could be preferred partly because it is used by Reed-Muller (RM) code and partly because of its simplicity. RM code can be regarded as a special example of polar codes, in that it is based on hamming weight rather than polarization reliability, and it uses a Maximum-Likelihood (ML) decoding algorithm (hamming-weight-based RM code approaches the ML performance boundary if code length is small) but it can be decoded with SC or SCL decoding.

Hamming weight of a sub-channel is defined herein to be the hamming weight of a row of a generator matrix. In a polar code, the hamming weight of a sub-channel is related to the row weight of this sub-channel in its generator matrix (row weight=2^(hamming weight)). In some embodiments, row weight indicates the number of the coded bits which the information of a sub-channel is distributed on. Generally speaking, the more coded bits an information bit input to a sub-channel is distributed on, the more robust that sub-channel is, and hence the higher reliability.

An example of how the hamming weight or a function of the hamming weight such as the row weight can be used as the second metric to select sub-channels for parity bits is discussed in more detail described in U.S. Provisional Patent Application 62/433,127 filed on Dec. 12, 2016 and entitled "Method for constructing a Parity Check (PC) Based Polar Code Using a Look-up-Table", which is incorporated by reference herein as if reproduced in its entirety. Note that these are just examples of a metric that could be used as a second metric. Generally, any other metric also indicative of the (polarization) reliability can be used as the second metric. In a further alternative, the second metric is different from the first metric but also relate to or is indicative of the polarization reliability. However, in yet another alternative, the natural order of sub-channels can be used as the second metric so that, for instance, sub-channels at the end of the information sub-channels are selected as the assistant sub-channels. In some embodiments, more than two metrics could be used for selecting assistant sub-channels. In addition, any of various assistant sub-channel selection algorithms using the above described metrics could be used. Other possibilities exist for selecting assistant sub-channels.

The embodiment techniques described in U.S. Provisional Patent Application 62/433,127 reserve and/or select candidate sub-channels for parity bit(s) prior to mapping the information bits to sub-channels. After the candidate sub-channels are reserved, the information bits are mapped to the most reliable remaining sub-channels, and a number of frozen bits are mapped to the least reliable remaining sub-channels. Thereafter, the parity bit values for the reserved sub-channels are determined based on a function of the information bits. Notably, the candidate sub-channels that are reserved for the parity bit(s) are not necessarily the most reliable sub-channels, but do generally include at least some sub-channels that are as reliable, or more reliable, than at least one of the sub-channels over which information bits are transmitted. In this way, information bits and parity bits are interspersed over the most-reliable channels in a manner that improves decoding probability.

As mentioned above, some sub-channels may be reserved or set aside for PC-bits during polar encoding. FIGS. 5A-5G illustrate an example of how that encoding process may occur when a sequence of four information bits is encoded into a mother code length of 16. FIG. 5A depicts a table listing sub-channels $u_0$, $u_1$, $u_2$, $u_3$, $u_4$, $u_5$, $u_6$, $u_7$, $u_8$, $u_9$, $u_{10}$, $u_{11}$, $u_{12}$, $u_{13}$, $u_{14}$, $u_{15}$ corresponding to a mother code length of 16. The second row of the table lists a channel polarization reliability for each sub-channel. The sub-channels may then be sorted based on the channel reliability. FIG. 5B depicts a table listing an ordered sequence (Q) of the sub-channels $u_0$, $u_1$, $u_2$, $u_4$, $u_8$, $u_3$, $u_5$, $u_6$, $u_9$, $u_{10}$, $u_{12}$, $u_7$, $u_{11}$, $u_{13}$, $u_{14}$, $u_{15}$. A row weight for each channel can then be computed as a function of the channel index. In one example, the row weight is calculated based on the following equation: $rw=2^{hw}$, where rw is the row weight for the given sub-channel, and hw is the hamming weight of a binary representation of the channel index. FIG. 5C depicts a table listing the binary representation, hamming weight, and row weight of each sub-channel in the order sequence of sub-channels.

Next, a sub-set of sub-channels is identified for determining a set of parameters $w_{min}$, $2*w_{min}$, $f_1$, and $f_2$, which will be used to reserve sub-channels for PC-bits. The sub-set of sub-channels for carrying the information and parity bits is equal to $K+F_p$, where K is the information block length (e.g. number of information bits to encode), and $F_p$ is a parameter corresponding to the number of parity bits to transmit over the channel. In an embodiment, $F_p$ is calculated according to the following function: $F_p=\log_2 N\times(\alpha-|\alpha\times(K/M-\frac{1}{2})|^2)$, where, N is the mother code length, M is the number of (coded) bits in the code word to be transmitted (e.g. after puncturing), K/M is the code rate achieved, and a is a weighting factor that is used to vary the ratio of parity bits to information bits. However, a different function for $F_p$ may be used, for example, $F_p=\log_2((M-K)/32$ which appears to work well for a relatively small number of parity bits. Alternatively, the function might be different for example if a different type of assistant bits (other than parity bits) and/or a different type of check function (other than a PC function) is used. Generally, the number of PC bits Fp may generally be any function of K, N (and M if M<N and shortening or puncturing is used). In yet another embodiment, $F_p$ might be a fixed value independent of K, N (and/or M), e.g., 3. In yet another embodiment, $F_p$ might represent a desired set or subset (e.g. 1) of the total number of parity bits (e.g. 3) which is to be mapped to candidate sub-channels (with a minimum row weight $w_{min}$) while the remaining parity bits (e.g. 2) are mapped to other sub-channels according to a different metric (e.g. the least reliable sub-channels within the K (or K+$F_p$) most reliable sub-channels Other possibilities exist for $F_p$.

In embodiments using PC bits and the above function for $F_p$, the a parameter is set to a value between 1 and 2. In other embodiments, the a parameter is set to a value between 1 and 1.5. A higher α value will generally yield a higher minimum code distance. In this example, $F_p$ is equal to 2. As such, the sub-set of sub-channels for carrying the information bits and parity bits includes the 6 most reliable sub-channels (i.e., K+$F_p$=4+2=6), which are sub-channels $u_{12}$, $u_7$, $u_{11}$, $u_{13}$, $u_{14}$, and $u_{15}$. Next, one or more row weight values are determined. As it can be seen, the minimum row weight $w_{min}$ in the K+Fp sub-set is 4. In this example, the row weight values include a minimum row weight ($w_{min}$) and twice the minimum row weight (2*$w_{min}$) in the subset of sub-channels $u_{12}$, $u_7$, $u_{11}$, $u_{13}$, $u_{14}$, and $u_{15}$ is determined, which is 4 and 8 respectively. A first index (f1) and a second index (f2) are also determined. The first index (f1) determines how many sub-channels having a row weight equal to $w_{min}$ are to be reserved for PC bits, and the second index (f2) determines how many sub-channels having a row weight equal to 2*$w_{min}$ are to be reserved for PC bits. In this example, $f_1$ and $f_2$, are equal to 1 and 1, respectively.

Thereafter, the sub-channels are reserved for PC-bits based on the parameters $w_{min}$, 2*$w_{min}$, $f_1$, and $f_2$. In this example, the most reliable sub-channel having a row weight $w_{min}$ (i.e., equal to 4) and the most reliable sub-channel having a row weight equal to 2*$w_{min}$ (i.e., equal to 8) are selected, which includes sub-channels $u_{12}$ and $u_{14}$. FIG. 5D depicts a table showing the sub-channels reserved for PC bits. Thereafter, the information bits are mapped to the remaining most reliable channels. FIG. 5E depicts a table showing how the sub-channels u15, u13, u11, and u7 are mapped to the four information bits. In this example, K=4 and N=16. In other examples, different numbers of information bits may be mapped to sub-channels. Thereafter, the remaining sub-channels are mapped to frozen bits. FIG. 5F depicts a table showing how the sub-channels u10, u9, u6, u5, u3, u8, u4, u2, u1, and u0 are mapped to frozen bits.

In some embodiments, the encoder selects some sub-channels in the frozen bit-set to carry PC bits after the frozen bit set is mapped. FIG. 5G depicts a table showing how frozen sub-channels can be selected to carry PC bits. As shown, sub-channels in the frozen set with a row weight equal to $w_{min}$ or 2*$w_{min}$ are selected to carry PC bits. In this example, sub-channels $u_{10}$, $u_9$, $u_6$, $u_5$, and $u_3$ are mapped as additional PC bits. In some other embodiments, all the frozen sub-channels could be selected as additional PC bits.

Instead of reserving or selecting $F_p$ sub-channels for $F_p$ PC bits based on $w_{min}$, 2*$w_{min}$, $f_1$ and $f_2$, the encoder may reserve sub-channels using a different set or a subset of those parameters. In one embodiment, $F_p$ sub-channels are reserved within the (K+$F_p$) most reliable sub-set of the N sub-channels or M<N sub-channels (if puncturing or shortening is used)) based (only) on $w_{min}$, for example, $F_p$ sub-channels with a row weight equal to a $w_{min}$ value (further details below) are reserved. In some implementations, if there are more sub-channels in the (K+$F_p$) sub-set with a row weight equal to $w_{min}$, the most reliable $F_p$ sub-channels are reserved. In some implementations, the same selection applies to the case when there are more than $f_2$ sub-channels with a row weight equal to 2*$w_{min}$ within the most reliable K+$F_p$ sub-channels. In other implementations, the least reliable $F_p$ sub-channels in the (K+$F_p$) sub-set with a row weight equal to $w_{min}$ (or 2*$w_{min}$) are reserved. In yet other implementations, the number of PC bits may be increased so that all of the sub-channels with a row weight equal to $w_{min}$ are reserved for the PC bits. In yet other implementations, $F_p$ represents a set or subset (e.g. 1) of the total number of sub-channels for PC bits (e.g. 3) to be reserved based on $w_{min}$ and/or 2*$w_{min}$, and a remaining subset (e.g. 2) of the total number of sub-channels for PC bits is reserved based on another metric, e.g., the least reliable sub-channels within the K (or K+$F_p$) most reliable sub-channels. Other implementations are possible.

In some embodiments, in addition to reserving $F_p$ sub-channels in the (K+$F_p$) sub-set, the encoder may select some sub-channels in the frozen bit-set (N−K−$F_p$) to carry additional PC bits. In other embodiments, all of the sub-channels in the frozen bit-set are selected to carry PC bits in addition to the $F_p$ sub-channels in the (K+$F_p$) sub-set with a row weight equal to $w_{min}$.

In some embodiments, when PC bits are mapped based on row weights associated with the sub-channels, the row weight computations may introduce latency into the encoding process. Other embodiments of this disclosure mitigate that latency by reserving sub-channels based on their hamming weights, thereby avoiding the additional step of calculating row weights. FIGS. 6A-6G illustrate an example of how hamming weights can be used to reserve sub-channels for PC bits during a polar encoding process. In this example, a sequence of four information bits is encoded into a mother code length of 16. FIG. 6A depicts a table listing sub-channels $u_0$, $u_1$, $u_2$, $u_3$, $u_4$, $u_5$, $u_6$, $u_7$, $u_8$, $u_9$, $u_{10}$, $u_{11}$, $u_{12}$, $u_{13}$, $u_{14}$, $u_{15}$ corresponding to a mother code length of 16. The second row of the table lists a channel polarization reliability for each sub-channel. The sub-channels may be sorted based on the channel reliability. FIG. 6B depicts a table listing an ordered sequence (Q) of the sub-channels $u_0$, $u_1$, $u_2$, $u_4$, $u_8$, $u_3$, $u_5$, $u_6$, $u_9$, $u_{10}$, $u_{12}$, $u_7$, $u_{11}$, $u_{13}$, $u_{14}$, $u_{15}$. A hamming weight of each channel index can be determined for each sub-channel. FIG. 6C depicts a table listing the hamming weight of each sub-channel in the ordered sequence of sub-channels.

Next, a sub-set of sub-channels is identified for determining the minimum hamming weight ($u_{min}$) as well as the $f_1$, and $f_2$ parameters, which will be used to reserve sub-channels for PC-bits. The sub-set of sub-channels for carrying the information and parity bits is equal to K+$F_p$, where K is the information block length, and $F_p$ is a parameter calculated according to the following function: $F_p=\log_2 N\times(\alpha-|\alpha\times(K/M-\frac{1}{2})|^2)$, where N is the mother code length, M is the number of coded bits in the code word to be transmitted (e.g. after puncturing), K/M is the code rate achieved and a is a weighting factor that is used to vary the ratio of parity bits to information bits. However, depending on the implementation, a different function for $F_p$ may be used, for example, $F_p=\log_2((M-K)/32)$ which appears to work well for a relatively small number of PC bits. Alternatively, a different function may be used, for example if a different type of assistant bits (other than PC bits) and/or a different type of check function (other than a PC function) is used. Generally, the number of PC bits $F_p$ may generally be any function of K, N but also M (if M<N and shortening or puncturing is used). In another embodiment, $F_p$ might be a fixed value independent of K, N (and/or M), e.g., 3 or might represent a desired set or subset (e.g. 1) of the total number of parity bits (e.g. 3) which is to be mapped to candidate sub-channels with a minimum row weight $w_{min}$ while the remaining parity bits (e.g. 2) are mapped to other sub-channels according to a different metric (e.g. the least reliable sub-channels within the K (or K+$F_p$) sub-channels. In the example of FIG. 6A-6G, $F_p$ is equal to 2, and the sub-set of most reliable sub-channels includes the 6 most reliable sub-channels (i.e., K+$F_p$=4+2=6), which are sub-channels $u_{12}$, $u_7$, $u_{11}$, $u_{13}$, $u_{14}$, and $u_{15}$. Next, the minimum hamming weight for the sub-set of sub-channels determined. In this example, the minimum hamming weight is 2 based on the hamming weight of sub-channel $u_{12}$. A first index (f1) and a second index (f2) are also determined. The first index (f1) determines how many sub-channels having a hamming weight equal to $u_{min}$ are to be reserved for PC bits, and the second index (f2) determines how many sub-channels having a hamming weight equal to 1+$u_{min}$ are to be reserved for PC bits. In this example, $f_1$ and $f_2$, are equal to 1 and 1, respectively.

Thereafter, the sub-channels are reserved for PC-bits based on the parameters $u_{min}$, 1+$u_{min}$, $f_1$, and $f_2$. In this example, the most reliable sub-channel having a hamming weight equal to $u_{min}$ (i.e., equal to 2) and the most reliable sub-channel having a hamming weight equal to 1+$u_{min}$ (i.e., equal to 3) are selected, which includes sub-channels $u_{12}$ and $u_{14}$. FIG. 6D depicts a table showing the sub-channels reserved for PC bits. Thereafter, the information bits are mapped to the remaining most reliable sub-channels. FIG. 6E depicts a table showing how the sub-channels u15, u13, u11, and u7 are mapped to the four information bits. Thereafter, the remaining sub-channels are mapped to frozen bits. FIG. 6F depicts a table showing how the sub-channels u10, u9, u6, u5, u3, u8, u4, u2, u1, and u0 are mapped to frozen bits.

In some embodiments, the encoder selects additional sub-channels from the frozen bit-set to carry PC bits. FIG. 6G depicts a table showing how sub-channels in the frozen set having a hamming weight equal to $u_{min}$ or 1+$u_{min}$ are selected to carry PC bits. In this example, sub-channels $u_{10}$, $u_9$, $u_6$, $u_5$, and $u_3$ are reserved to carry additional PC bits. In some other embodiments, all the frozen sub-channels could be selected as additional PC bits.

Instead of reserving or selecting $F_p$ sub-channels for $F_p$ PC bits based on $u_{min}$, $f_1$ and $f_2$, the encoder may reserve sub-channels using a different set or a subset of those parameters. In one embodiment, $F_p$ sub-channels are reserved within the (K+$F_p$) most reliable sub-set of the N (or M<N if puncturing or shortening is used) sub-channels based (only) on $u_{min}$, for example, $F_p$ sub-channels with a hamming equal to a $u_{min}$ value (further details below) are reserved. In some implementations, if there are more sub-channels in the (K+$F_p$) sub-set with a hamming weight equal to $u_{min}$, the most reliable $F_p$ sub-channels are reserved. In some implementations, the same selection applies to the case when there are more than $f_2$ sub-channels with a row weight equal to 2*$w_{min}$ within the most reliable K+$F_p$ sub-channels). In other implementations, the least reliable $F_p$ sub-channels in the (K+$F_p$) sub-set are reserved. In yet other implementations, the number of PC bits may be increased so that all of the sub-channels with a hamming weight equal to $u_{min}$ are reserved for the PC bits. In yet other implementations, $F_p$ represents a subset (e.g. 1) of the total number of sub-channels for PC bits (e.g. 3) to be reserved based on $w_{min}$ and/or 2*$w_{min}$, and a remaining subset (e.g. 2) is reserved based on another metric, e.g., the least reliable sub-channels within the K (or K+$F_p$) most reliable sub-channels. Other implementations are possible.

In some embodiments, in addition to reserving $F_p$ sub-channels in the (K+$F_p$) sub-set, the encoder may select some sub-channels in the frozen bit-set (N-K-$F_p$) to carry additional PC bits. In other embodiments, all of the sub-channels in the frozen bit-set are selected to carry PC bits in addition to the $F_p$ sub-channels in the (K+$F_p$) sub-set with a row weight equal to $w_{min}$.

Figure 7:
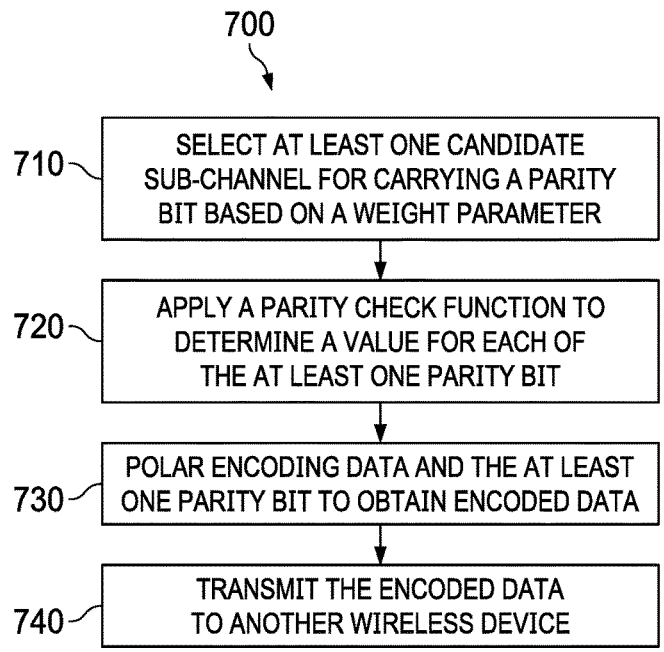
FIG. 7 is a flowchart of an embodiment method for encoding a sequence of information bits.

Embodiments of this disclosure provide techniques that select, reserve or allocate one or more sub-channels for parity bits based on a weight parameter. FIG. 7 is a flowchart of a method 700 for encoding a data using a polar code, as may be performed by a wireless device. At step 710, the wireless device (pre-) selects from a segment of sub-channels which may be ordered based on a reliability metric, at least one sub-channel for carrying at least one parity bit (e.g. a candidate sub-channel) based on a weight parameter. The weight parameter may be a minimum row weight (e.g. $w_{min}$, $d_{min}$) parameter. In one example, the ordered sub-channels include a segment of K sub-channels and a segment of $N_0$-K sub-channels, and the wireless device selects, from the segment of K sub-channels, the at least one candidate sub-channel with a minimal weight ($d_{min}$). In such an example, each of the K sub-channels has a higher reliability metric than all of the $N_0$-K sub-channels. In this example, K refers to the number of information bits to encode or an information block length which may or may not include other assistant bits (e.g. CRC bits) and $N_0$ refers to a mother code length. In another example, if a number n of sub-channels with a minimal weight in the segment K is greater than a predetermined value F, the wireless device selects F sub-channels from the segment of K sub-channels with a minimal weight in a descending order of the reliability metric (e.g. from a high reliability to a low reliability). In another example, the wireless device selects a first number of sub-channels based on the minimum weight ($d_{min}$) and/or a second number of sub-channels based on twice the minimum weight (2*$d_{min}$). In yet another example, the wireless device selects at least one sub-channel, for example, based on a function of a code length associated with a polar code and an information block length of data that is to be encoded. In yet another example, the wireless device selects all sub-channels normally allocated to frozen bits as sub-channels for carrying the at least one parity bit.

In yet another example, the wireless device selects at least one sub-channel with a lowest row-weight in a subset of K most reliable sub-channels of an ordered sequence of (N) sub-channels. In this example, a row-weight of a sub-channel is a number of ones in a row of an (N-sized) Kronecker matrix corresponding to the sub-channels. In yet another example, if a number n of sub-channels with the lowest row-weight amongst the K most reliable sub-channels is greater than a predetermined number $F_p$, the wireless device may select $F_p$ sub-channels among the n sub-channels (e.g. with the lowest row-weight) in the subset of K most reliable sub-channels. In yet another example, the at least one sub-channel with a lowest row-weight is selected from the subset of K most reliable sub-channels according to a descending reliability order. In other words, the at least one sub-channels selected is/are the most reliable sub-channels in the K subset with a lowest row-weight.

At step 720, the wireless device applies a parity check function to determine a value for each of the at least one parity bit. The parity check function may be performed over the sub-channels selected for the at least one parity bit. The parity check function might be a prime number parity check function. At step 730, the wireless device polar encodes information bits and the at least one parity bit placed in the selected sub-channels to obtain encoded data. In one example, the at least one parity bit is placed in a first number of sub-channels with a minimal weight and/or a second number of sub-channels with twice the minimal weight. Although not shown, the wireless device may also select sub-channels for the information bits in the ordered sequence of sub-channels, skipping the at least one sub-channel selected for the at least one parity bit, until a number of the sub-channels selected for the information bits reaches K (i.e. the total number of information bits to encode). At step 740, the wireless device transmits the encoded data to another wireless device.

Figure 8:
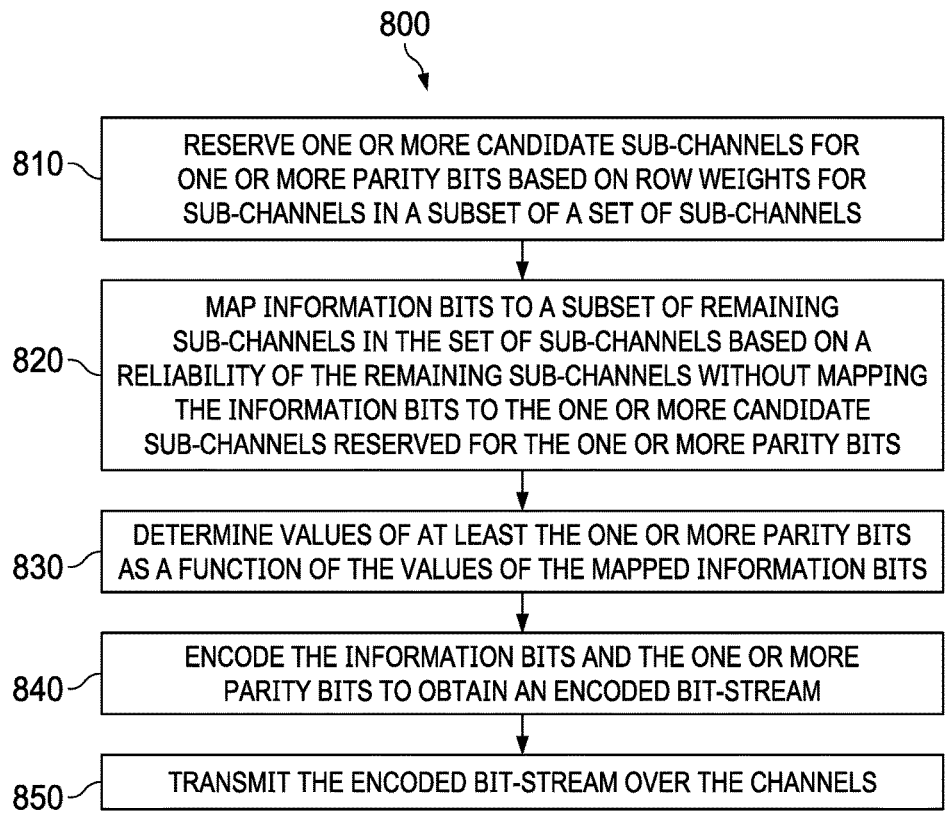
FIG. 8 is a flowchart of an embodiment method for encoding a sequence of information bits.

FIG. 8 is a flowchart of an embodiment method 800 for encoding data using a polar code, as may be performed by a wireless device. At step 810, the wireless device reserves or otherwise allocates one or more (candidate) sub-channels for one or more parity bits based on row weights for sub-channels in a subset of a set or sequence of (N) sub-channels which may be ordered e.g. based on a reliability metric. The row weights may include a minimum row weight value ($w_{min}$) and/or an integer multiple of the minimum row weight parameter (e.g., $2*w_{min}$). The row weight for a sub-channel may represent the number of ones in a row corresponding to the sub-channel of an N-sized Kronecker matrix. There are various techniques for reserving (i.e. allocating) candidate sub-channels for parity bits from the ordered sub-channels. For instance, after the set of sub-channels has been sorted based on their reliabilities, the wireless device may reserve candidate sub-channels from a most reliable subset of sub-channels in the set based on their row weights starting from the highest reliability sub-channel. In one example, the first (i.e. most reliable) $f_1$ sub-channels that have a row weight equal to the minimum row weight value where $f_1$ is an integer, greater than zero), are reserved for parity bits. In such an example, the minimum row-weight may be the lowest row weight associated with the most reliable K or K+$F_p$ sub-channels in the ordered sequence of sub-channels, where K is an information block length associated with the sequence of information bits, and $F_p$ is a parameter or a function corresponding to a number of parity bits carried by the encoded bit-stream. In such an embodiment, $F_p$ may be calculated according to the following function: $F_p = \log_2 N \times (\alpha - |\alpha \times (K/M - \frac{1}{2})|^2)$, where M is the transmitted block length, N is the mother code length, and $\alpha$ is a weighting factor that is used to vary the ratio of parity bits to information bits. Other values for $F_p$ are also possible. In another example, the first $f_2$ sub-channels having a row weight equal to twice the minimum row weight value, may also be reserved for parity bits (where $f_2$ is also integer, greater or equal to zero). The $f_1$ parameter may be calculated according to the following function: $f_1 = (F_p + \min(F_p, n))/2$, where n is the number of sub-channels, in the most reliable K+$F_p$ sub-channels of the ordered sequence of sub-channels, that have a row-weight equal to the minimum row-weight. The $f_2$ parameter may be calculated according to the following function: $f_2 = (F_p - \min(F_p, n))/2$. Other values may be possible for the $f_1$ and $f_2$ parameters.

In another embodiment, $F_p$ might be a fixed value (e.g. 3) independent of the information block size and code length. Alternatively, $F_p$ might be a desired subset (e.g. 1) of the total number of parity bits to be used (e.g. 3) and which is to be mapped to candidate sub-channels with a minimum row weight $w_{min}$ in a most reliable subset of sub-channels (e.g. K or (K+$F_p$)) while the remaining parity bits (e.g. 2) are mapped to other sub-channels according to a different metric (e.g. the least reliable sub-channels within the K (or K+$F_p$) most reliable sub-channels).

At step 820, the wireless device maps information bits to a subset of remaining sub-channels in the set of sub-channels based on a reliability of the remaining sub-channels, for example, without mapping the information bits to the one or more candidate sub-channels reserved for the one or more parity bits. At step 830, the wireless device determines (e.g., calculates) values of at least the one or more parity bits as a function of the values of the information bits and maps the one or more parity bits to the candidate sub-channels reserved (not shown). At step 840, the wireless device encodes the mapped information bits and the one or more parity bits using a polar code to obtain encoded bits or an encoded bit stream. At step 850, the wireless device transmits the encoded bits over the (physical) channel.

Embodiments of this disclosure provides a method for a device such as a wireless device for implementing a parity check function prior to encoding. During a first step, the wireless device obtains or checks out an ordered sequence of the reliability (Q) and determines a punctured-bit set (P) based on a code rate (R) and a mother code length (N).

During a second step, the device determines a frozen-bit set, a PC-frozen-bit set, and an information-bit set from the ordered sequence. The second step may include several substeps 2.1-2.4(d). In substep 2.1, the wireless device may divide the sequence Q, (ordered by an ascending reliability from left to right) into three subsets, namely an (N–M)-subset, an (M–K)-subset, and a (K)-subset. An example of this is shown in table 2. As it can be seen, the K-subset represents the most reliable bit positions (sub-channels) in the sequence Q. During substep 2.2, the wireless device may determine a minimum or lowest row-weight in the (K)-subset and denote it as $d_{min}$, where the row-weight for a sub-channel represents the number of "ones" in a row of its Kronecker matrix corresponding to the sub-channel. As noted above, the row-weight is also a power of 2 with the exponent being the number of "ones" in the binary representation of the sub-channel index. The wireless device may then determine the number of bit positions (n) in the (K)-subset that have a row weight equal to $d_{min}$. During substep 2.3, the wireless device selects or flags a set of sub-channels, in the K-subset, for PC-frozen bits according to $d_{min}$. Specifically, the wireless device may determine a number ($F_p$) of parity check (PC) frozen (PC-frozen) bits based on a function of a mother code length of the polar code and a number of information bits in the sequence of information bits. In one example, $F_p$ is computed according to the following function: $F_p = \text{ceil}(\log_2(N*K)/2)$. The wireless device may then select and/or flag a number of sub-channels for PC frozen bits. If n<$F_p$, the wireless device may select and/or flag as PC frozen bits ($F_p$+n)/2 sub-channels with row-weight $d_{min}$ according to a descending reliability order, as well as select and/or flag ($F_p$–n)/2 sub-channels with row-weight $2 \times d_{min}$ according to a descending reliability order. If $n \geq F_p$, the wireless device may select and/or flag as PC-frozen bits $F_p$ sub-channels with a row-weight $d_{min}$ according to a descending reliability order. In another embodiment, $F_p$ might be a fixed value, independent of information block size and code length e.g., 3. Alternatively, $F_p$ might represent a desired set or subset (e.g. 1) of the total number of parity bits (e.g. 2) that is to be mapped to sub-channels with a minimum row weight ($d_{min}$) or twice the minimum row weight ($2 \times d_{min}$) while the remaining parity bits (e.g. 2) are mapped to other sub-channels according to a different metric (e.g. the least reliable sub-channels within the K-subset or the K+$F_p$ subset). In substeps 2.4(a)-2.4(d), the wireless device may determine the position for information, PC-frozen and frozen bits. In particular, in substep 2.4(a), the wireless device may select the information bit positions one by one from the rightmost to the leftmost (in a reliability descending order), skipping the flagged bit positions, until the number of the information bit positions reaches K. In substep 2.4(b), the wireless device may flag the remaining bit positions to be the frozen bits. In substep 2.4(c), the wireless device may select some frozen bit positions e.g., those that have a row-weight equal to the pre-selected PC-frozen bits as additional PC-frozen bits, or all the frozen bit positions as additional PC-frozen bits. In step 2.4(d), the wireless device may prepare the bit sequence for polar encoding e.g. with an Arikan kernel. The wireless device may insert the K-information bits, and mark the PC-frozen and frozen bits.

During step 3, the wireless device may set values for the PC-frozen bits based on a parity check function. In one example, this is achieved by applying a cyclic shift on a register with length of a prime value.

TABLE 2

| N - M | M - K | K |
|---|---|---|

Figure 9:
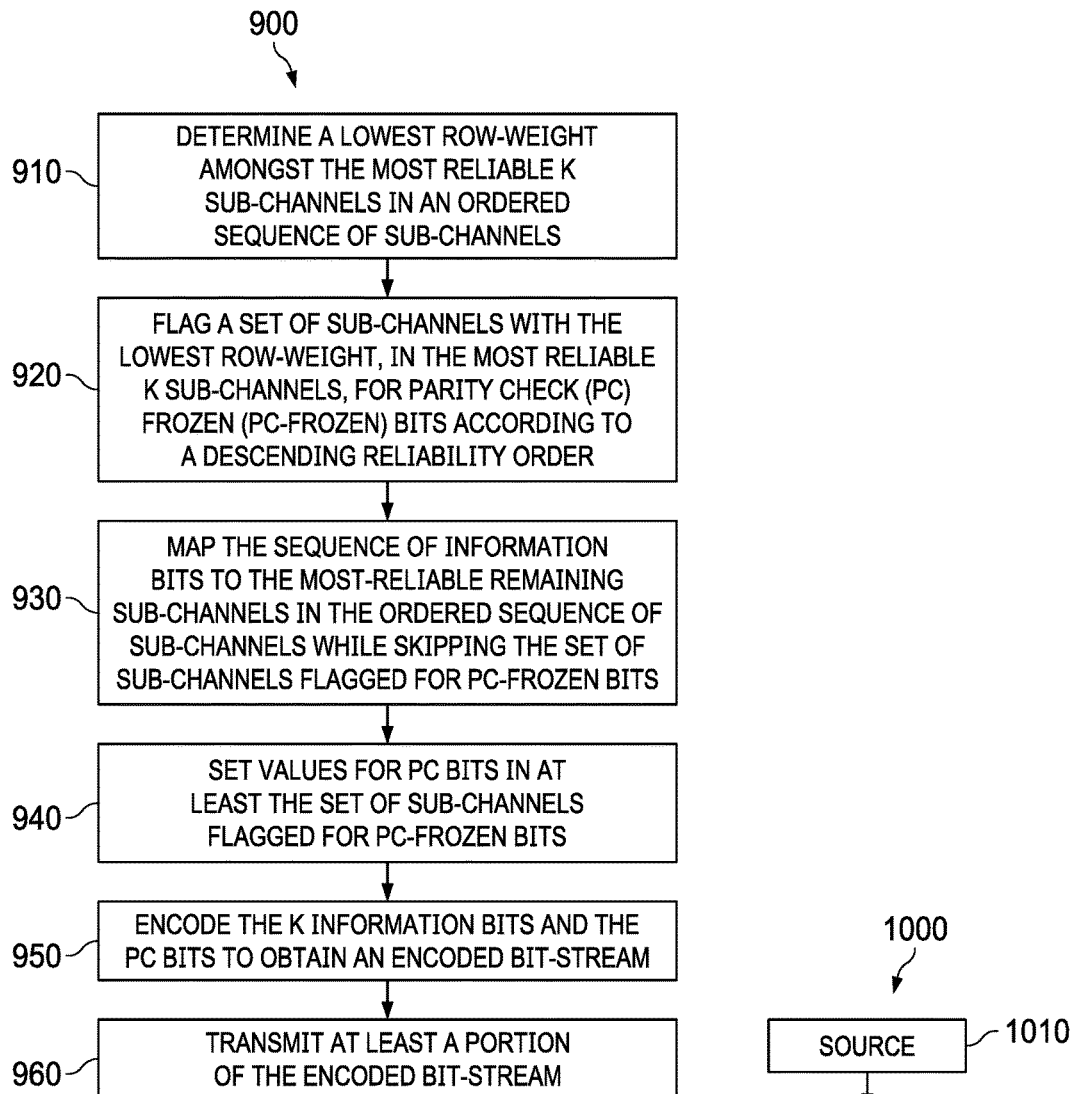
FIG. 9 is a flowchart of an embodiment method for encoding a sequence of information bits.

FIG. 9 is a flowchart of an embodiment method 900 for encoding data using a polar code, as may be performed by a wireless device. At step 910, the wireless device determines a lowest row-weight ($d_{min}$) amongst the most reliable K sub-channels in an ordered sequence of sub-channels. At step 920, the wireless device selects or flags a set of sub-channels, in the most reliable K sub-channels, for parity check (PC) frozen (PC-frozen) bits according to the lowest row weight. It should be appreciated that the set of sub-channels, which are selected or flagged, may include a one or more sub-channels. Optionally, if there are less sub-channels with the lowest row-weight ($d_{min}$) for example n, than a predetermined number of PC-frozen bits, for example $F_p$, the wireless device selects or flags as PC-frozen bits ($F_p$+n)/2 sub-channels with row-weight $d_{min}$ in the ordered sequence according to a descending reliability order, as well as flags ($F_p$−n)/2 sub-channels with row-weight $2 \times d_{min}$ in the ordered sequence according to a descending reliability order. Optionally, if the number n of sub-channels with the lowest row-weight ($d_{min}$) is greater than $F_p$, the wireless device selects or flags as PC-frozen bits $F_p$ sub-channels with row-weight $d_{min}$ in the ordered sequence according to a descending reliability order. At step 930, the wireless device maps a sequence K of information bits to the most-reliable remaining sub-channels in the ordered sequence of sub-channels while skipping the set of sub-channels flagged for PC-frozen bits. At step 940, the wireless device sets values for PC bits in at least the set of sub-channels flagged for PC-frozen bits, and polar encodes the K information bits with the PC-frozen bits at step 950, thereby obtaining encoded bits or an encoded bit-stream. At step 960, the wireless device transmits at least a portion of the encoded bits/bit-stream.

Figure 10:
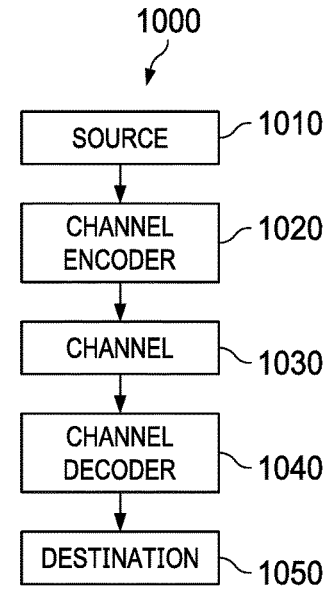
FIG. 10 is a block diagram of a communication system.

FIG. 10 shows a communication system 1000. A source 1010 provides the information data (bearer data, information blocks, bits), a (channel) encoder 1020 encodes the information data, the encoded information data is transmitted over the channel 1030 and then decoded in a (channel) decoder 1040 so that the information data is finally received at the destination 1050. The source 1010 and/or the channel encoder 1020 may be embedded or included in a transmission point or wireless device such as a network component or a user equipment. The network component may be an access point such as an evolved NodeB (eNodeB), a WiFi access point, a small cell (pico cell, femto cell) access point or any other access point providing access to a network. The channel encoder 1020 may be implemented in many different ways. For example, the channel encoder 1020 may be implemented in hardware only (in circuitry, such as a processor, that is configured to encode data and/or control operation of the encoder or other component(s) of the device, and/or to otherwise control the execution of functionality and/or embodiments as disclosed herein. In a processor-based implementation of the encoder, processor-executable instructions to perform encoding operations are stored in a non-transitory memory or storage medium internal or external of the transmission point or device. The non-transitory medium could include, in a memory for example, one or more solid-state memory devices and/or memory devices with movable and possibly removable storage media. The encoder 1020 could be configured to interface with a separate (Radio-Frequency-RF) transmission module. For example, the encoder 1020 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to encode data as described herein for transmission by a separate (RF) unit.

The (channel) decoder 1040 and the destination 1050 may be included in a reception point or another wireless device such as a network component or a user equipment (UE) and may be implemented in the network component or device in many different ways as well, including for example, in hardware or circuitry such as a chipset or a processor configured to execute instructions to perform decoding operations. The UE may be a wireless phone, smartphone, tablet, personal assistant, or any other mobile device. In various embodiments the source 1010 and the channel encoder 1020 can be implemented in the UE and the channel decoder 1040 and the destination 1050 may be implemented in an access point or vice versa. The channel 1030 may be a channel over the air or a fixed line such as a cable or bus. The channel 1030 may be a physical layer of a wireless interface. The channel 130 may be any other transmission medium. The communication system 1000 may be used not only for transmitting wireless data but also for transmitting wireline or any other data.

A polar code is a linear block error correcting code that uses relatively reliable sub-channels for information bits and relatively unreliable sub-channels for frozen bits that may be zeros or any other known value. The minimum-coding-distance can be increased if parity check could be operated over some of the less unreliable frozen bits. The frozen bits used for parity bits are called dynamic frozen bits because their bit values change dynamically with the data information being transmitted.

In conventional applications the decoder uses a successive cancellation (SC) method to identify the best sub-channels for transmitting the information block (information bits). To improve performance, a CRC-aided SC list decoding algorithm is used to allow multiple SC decoding paths and then CRC is used to select the right path at the last stage. This method consumes the detection capability of the CRC bits, after which they cannot be used for other purposes such as blind detection. A non-CRC-aided list decoder preferably has some method of performing a parity check based on a source other than the CRC bits. In some polar codes, parity bits are put onto a portion of the frozen bits (dynamic frozen set) to provide parity check ability. However, performance of the polar code operation depends on the selection of the dynamic frozen set and the parity check method over them and it is very difficult to select the proper frozen set(s) (bit or symbol) in a deterministic way because there are too many of them.

In embodiments, selecting dynamic frozen bit sets is a function of the minimum coding distance or a function of the minimal reliable weight such as polarization weight. Other reliability metrics can be used too. Embodiments provide a polar code based on the properly selected dynamic frozen bits showing good and reliable block error rate (BLER) performance. The polar code may be a cyclic redundant check (CRC) less polar code. In various embodiments all frozen-bits are selected as dynamic frozen bits and a prime-number-derived check function is applied over all of them.

Figure 11:
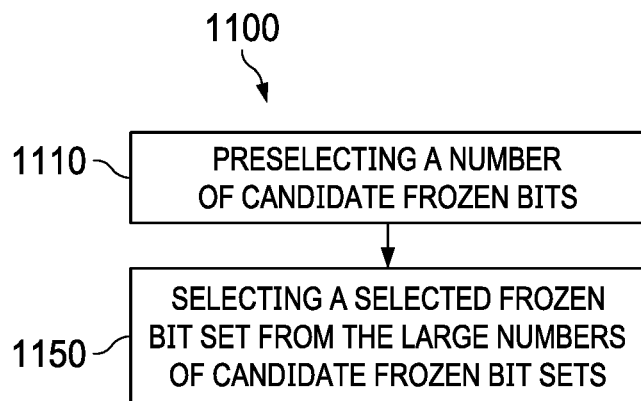
FIG. 11 is a flowchart of an embodiment method for selecting frozen bits during polar encoding.

FIG. 11 is a flowchart of an embodiment method 1100 for selecting a frozen bit set for a polar code. The coding method may be implemented in both encoder and a decoder. The coding method includes preselecting, at step 1110, a number of candidate frozen sets (or a large number of candidate frozen bit sets) and then selecting, at step 1150, from the number of candidate bit sets, a selected frozen bit set.

The step 1110 includes sorting the pre-selected sub-channels of the frozen bits according to the reliability metric applied to their sub-channels. In some embodiments, the step 1110 includes sorting all of the sub-channels according to a reliability metric function. In various embodiments, a deterministic function may be used such as a polarization weight algorithm. Alternatively, the deterministic function may be a polarization distance function. The sub-channels of the frozen bits may be sorted in an ascending manner, i.e., from a low polarization weight to a high polarization weight (or vice versa). The sorted channels are then divided into a plurality of segments such as 2 segments. In a next step, a minimal weight $d_{min}$ in the upper segment (or in other words, in the segment with the most reliable sub-channels) is selected or determined (see example below). In one example, the weight of a sub-channel may be a row weight, i.e., the number of "ones" in the row of the Polar code generator matrix or Kronecker matrix which corresponds to the sub-channel, or equivalently a power of 2 with the exponent being the number of "ones" in the binary representation of the sub-channel index. In that example, the minimal weight, $d_{min}$, may be a minimum row weight. For the minimal weight $d_{min}$, the number of channels with the minimal weight $d_{min}$ may be n. Define a predetermined value F. In an embodiment F may be F=ceil (LOG$_2$(N*K)/2). In other embodiments, F may have a different value. In yet other embodiments, F represents a set or subset (e.g. 1) of the total number of sub-channels for dynamic frozen bits (e.g. 3) to be pre-selected based on $d_{min}$ and/or 2*$d_{min}$, and a remaining subset (e.g. 2) of the total number of sub-channels for dynamic frozen bits is pre-selected based on another metric, e.g., the least reliable sub-channels within the K most reliable sub-channels. Pre-select (F−n)/2 channels with weight $d_{min}$ and pre-select (F+n)/2 channels with weight 2×$d_{min}$ when n>F. Pre-select F channels with weight $d_{min}$ when n≥F. Order the pre-selected channels in a reverse order. For example, the channels are ordered in a descending way, i.e., with polarization weight value from high to low or in a reliability descending order. In other words, the most reliable sub-channels with weight $d_{min}$ and/or 2*$d_{min}$ in the K most reliable segment are pre-selected. Accordingly, step 1110 provides a large number of ordered pre-selected sub channels (candidate bit sets), which, in some embodiments, can be used for dynamic frozen bits. It is understood however generally, the number of pre-selected sub-channels for dynamic frozen bits may be small or large.

In a practical example, $N_0$ is the mother code length, N is the code length after rate matching, and K is the information block length. In an embodiment, $N_0$ can be defined as $N_0 = 2\hat{}ceil(\log_2(N))$. The frozen bit sub-channels can then be sorted and segmented in to two segments or in other words, all of the bit sub-channels including the frozen bit sub-channels can be sorted and segmented into two segments, as shown in table 3. As can be seen, the sub-channels are sorted in ascending manner i.e. with the K sub-channels being the most reliable and the (N0−K) sub-channels being the least reliable.

TABLE 3

| No − K | K |
| --- | --- |

In the next step, at step 1150, a set of frozen bits (or in other words, sub-channels for frozen bits) is selected from or based on the large number of preselected candidate bit sets. The selected set of frozen bits may be selected bit-by-bit according to an ascending polarization weight order. The selected set of frozen bits or sub-channels for frozen bits may be complete when the number of bits is $N_0$−K. In some embodiments, the set of sub-channels selected for frozen bits includes some or all of the sub-channels pre-selected and some or all of the selected sub-channels may be used for dynamic frozen bits. In other embodiments, the set of sub-channels selected for frozen bits is separate from (i.e. does not include) the pre-selected sub-channels and the selected set of sub-channels may be complete when the number of sub-channels is $N_0$−K−F. All of the remaining (K) sub-channels (i.e. those not used for frozen and/or dynamic frozen bits) are sub-channels for the (K) information bits. In some embodiments, some of the selected frozen sub-channels (e.g. the preselected candidate frozen bit sets or all the frozen sub-channels) may be used for dynamic frozen bits.

Figure 12:
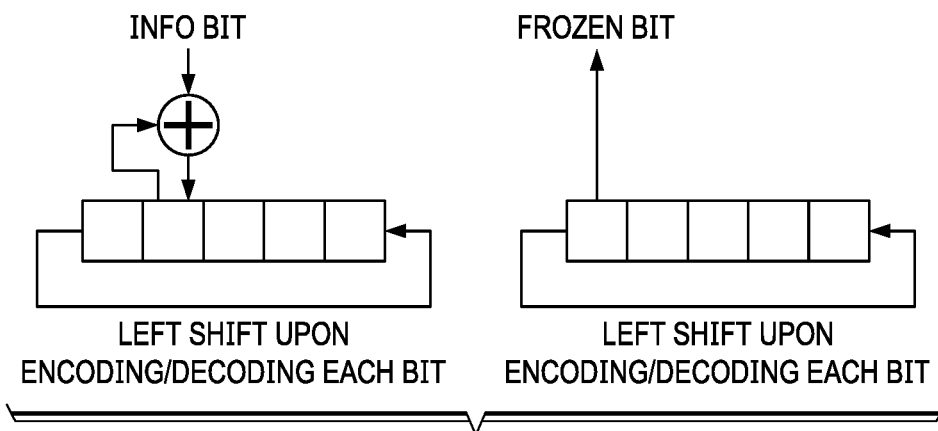
FIG. 12 is a block diagram of a register implemented in a polar encoder/decoder.

Selecting the selected set of frozen bits includes determining a prime number p. In various embodiments, unique prime number may be 5, 7 or 11. In order to finally select the frozen bit set, the encoder and the decoder may operate a p-length cyclic shift register implemented in the encoder and the decoder. The cyclic shift register may shift left upon encoding/decoding each bit. FIG. 12 shows such a cyclic shift register with the length 5(p-length) at least one of the encoder and the decoder. If a bit is an info bit in the register it is disregarded (XOR) and if the bit is a frozen bit the bit value of this bit is used and selected. In various embodiments, the bits are set to o when initialized in the register. In some embodiments, the frozen bit set can be changed from code word to code word.

In another embodiment, a third step constructs the parity check function and determines the bit values for the dynamic frozen bits as well as for information bits and (static) frozen bits. A prime number p is determined. In various embodiments, a unique prime number may be 5, 7 or 11. In order to construct the parity check function and determine the dynamic frozen bit values, a p-length cyclic shift register may be implemented in the encoder (and the decoder). The cyclic shift register may shift left upon determining a bit value for the input bit vector during encoding or upon decoding a bit value. FIG. 12 shows such a cyclic shift register with the length 5(p-length) at least one of the encoder and the decoder. As determined by the above two steps, if a bit is an information bit, the first bit in the register is XORed with the current information bit value and then cyclic shifted. If the bit is a (static) frozen bit, the bit value is set to fixed value (e.g., 0) known by both encoder and decoder and then cyclic shifted; if the bit is a dynamic frozen bit, the value of the first bit in the register is assigned as the value of the current dynamic frozen bit. In various embodiments, the bits are set to o when initialized in the register. In some embodiments, the frozen bit set can change from code word to code word.

Method 1100 may provide a plurality of advantages: The encoder may not need to perform online computing of parity functions. The encoder may not need to store parity functions. The decoder may not need to look up parity functions and therefore can be operated with less complexity.

Figure 13A:
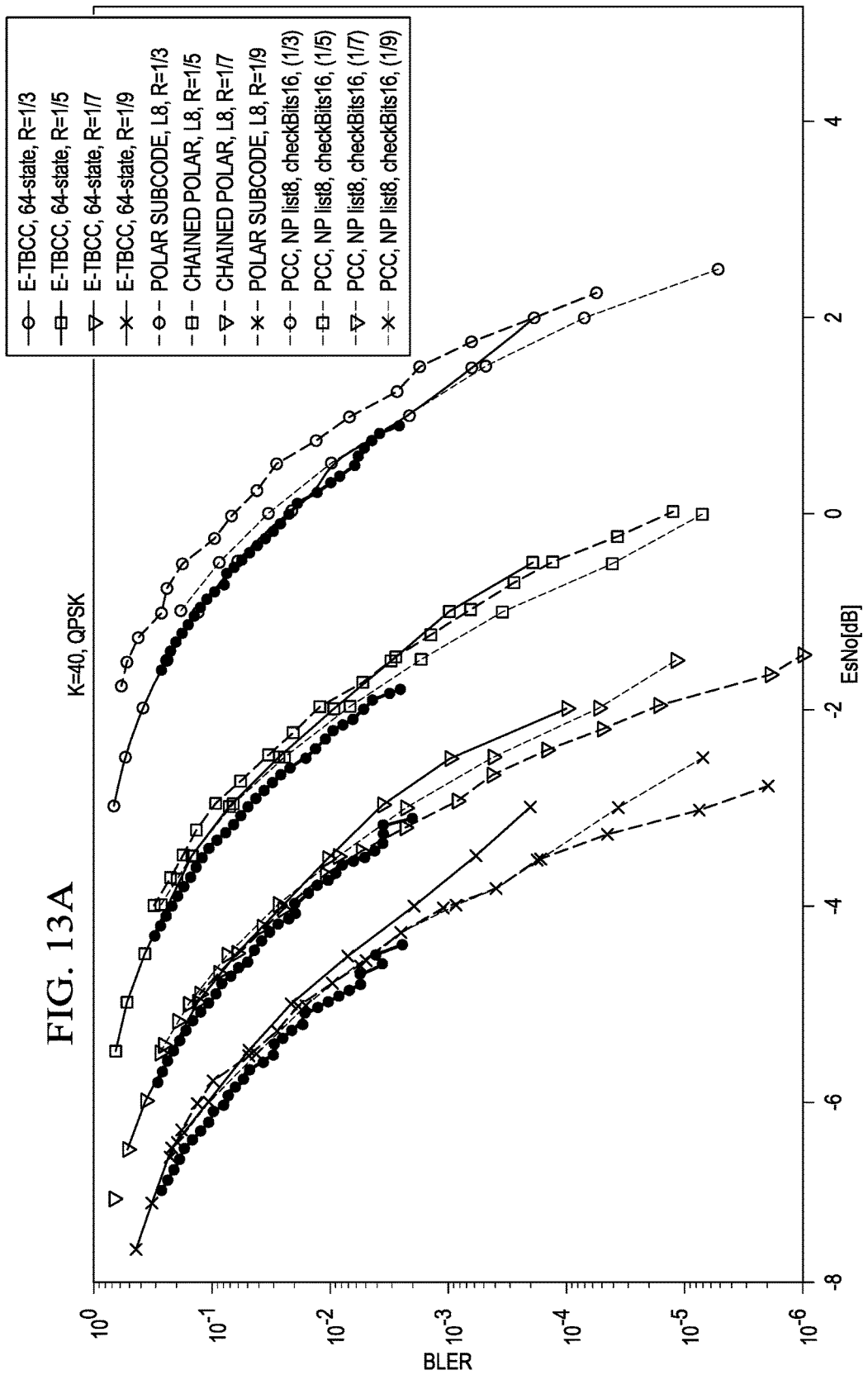
Figure 13B:
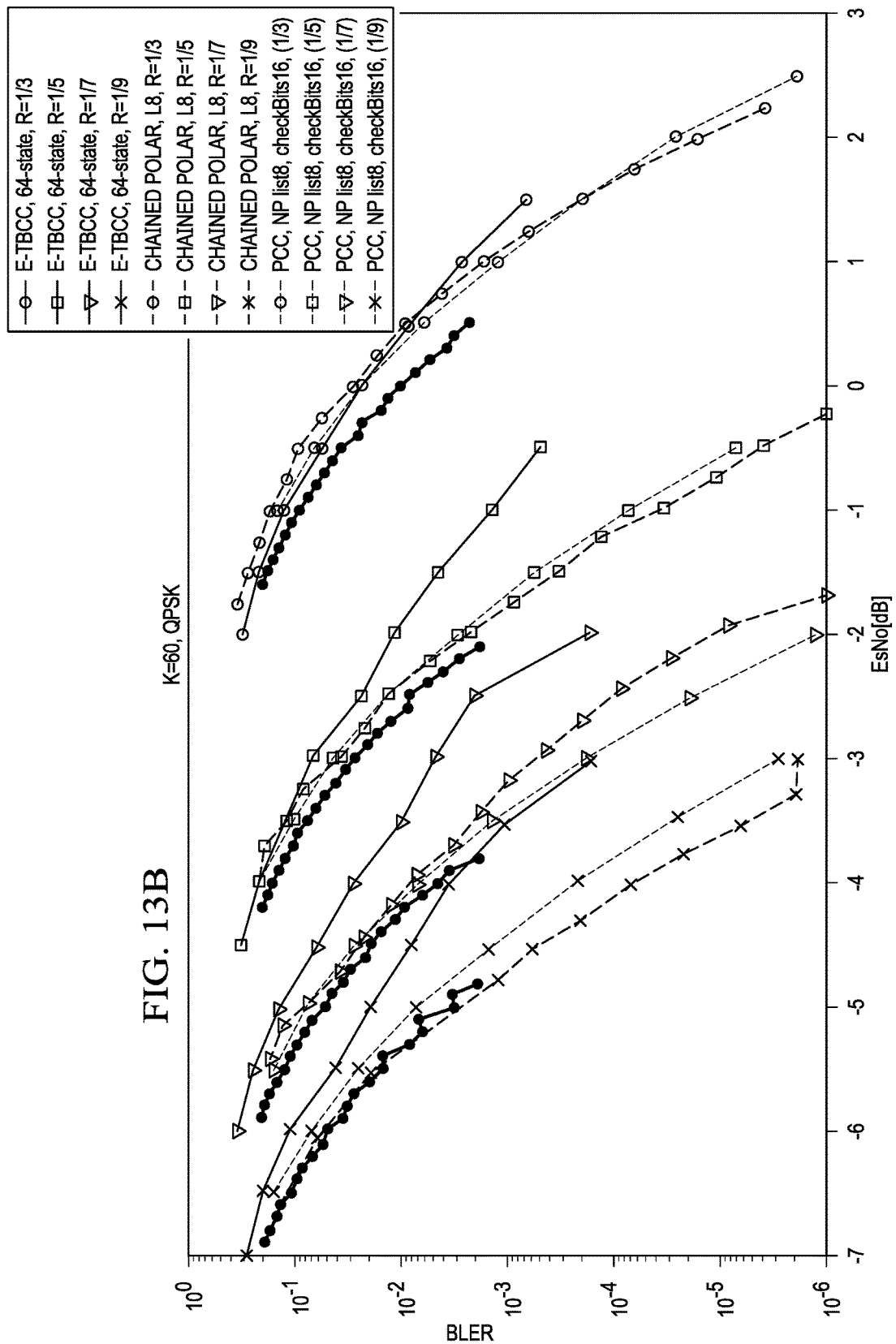
Figure 13C:
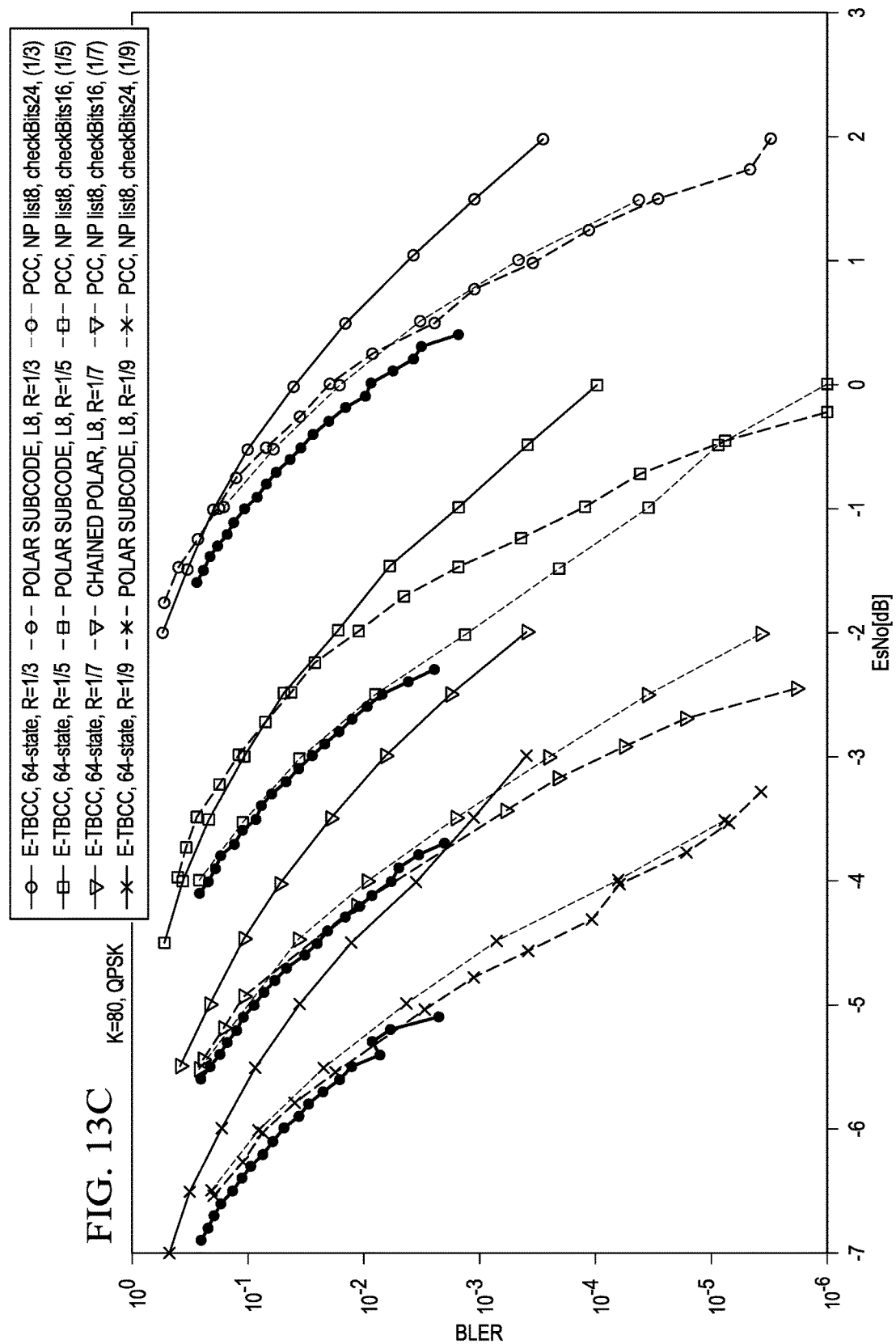

FIGS. 13A-13D show the performance of a polar code for a selected set of frozen bits selected according to embodiments. FIG. 13A shows the performance for K=40 information bits and for QPSK modulation, FIG. 13B shows the performance for K=60 information bits and for QPSK modulation, FIG. 13C shows the performance for K=80 information bits and for QPSK modulation, and FIG. 13D shows the performance for K=120 information bit and for QPSK modulation. As can be seen from the graphs, the inventive polar code provides a better performance and less complexity compared to the other graphs representing other codes.

Figure 14A:
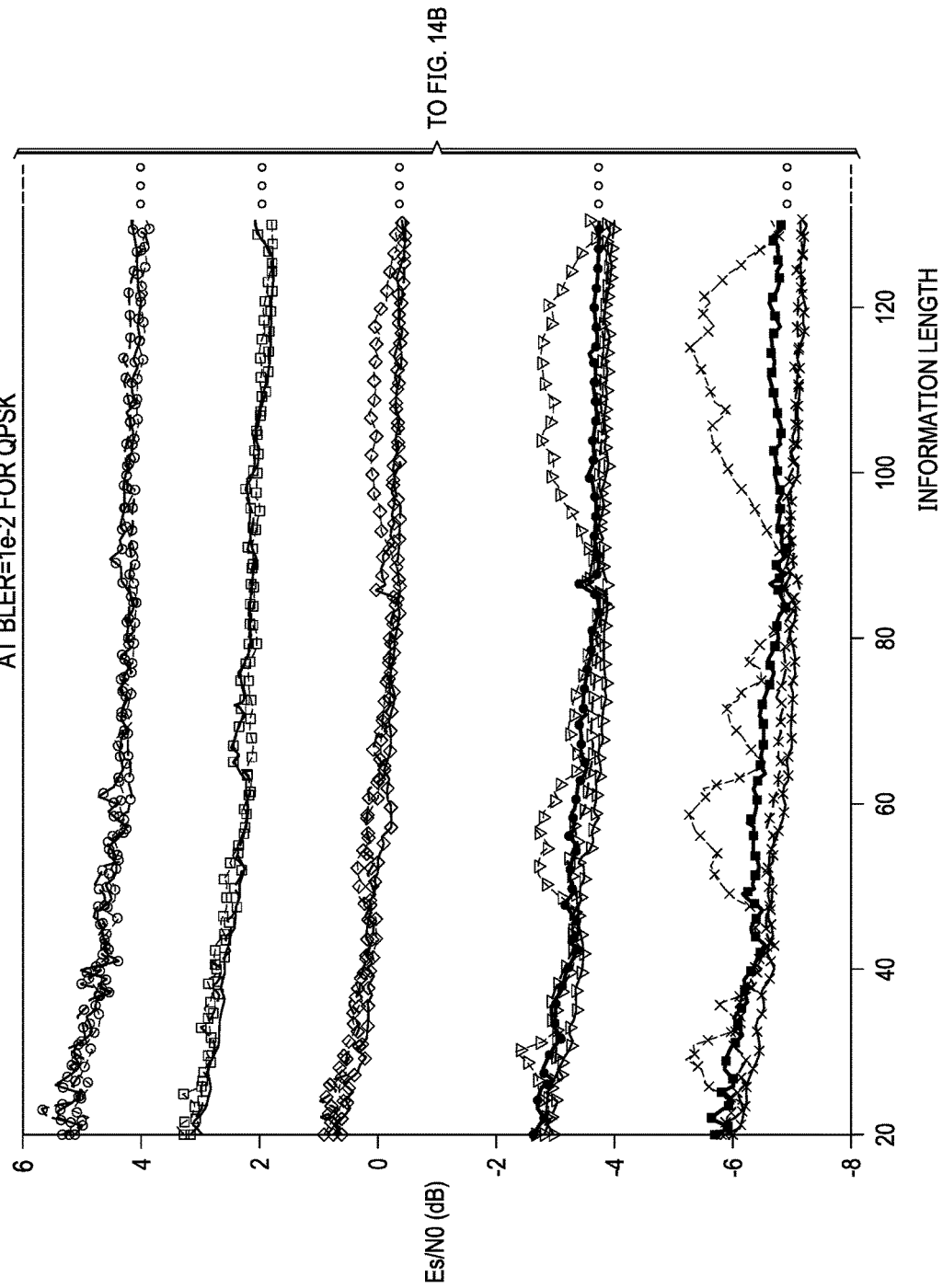
FIGS. 14A-14B is a graph of estimated noise levels achieved when using different polar codes to encode data streams.
Figure 14B:
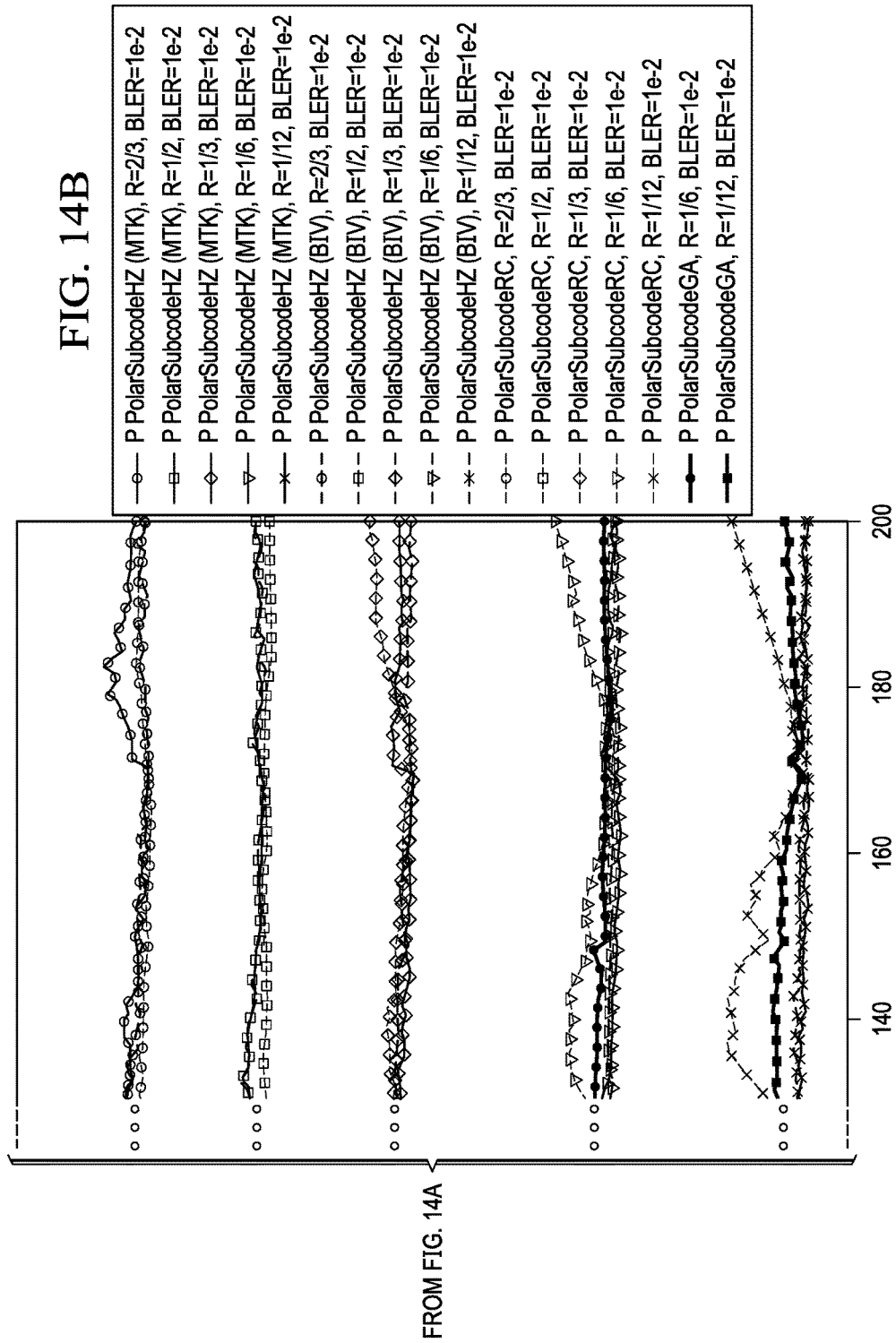

FIGS. 14A-14B shows the average received Es/N0 Points at block error rate (BLER). As shown in the graphs depicted by FIGS. 14A-14B, polar codes with the selected set of frozen bits (selected according to embodiment) provider superior performance than the other polar codes.

Figure 15:
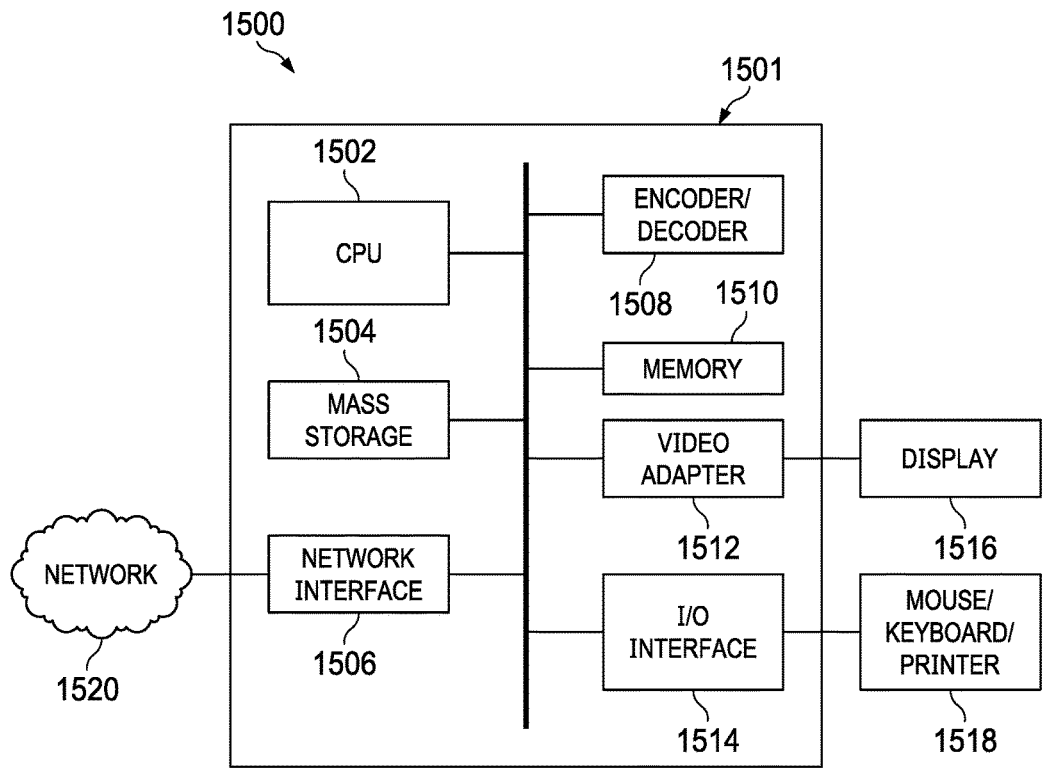
FIG. 15 is a block diagram of an embodiment wireless device.

FIG. 15 is a block diagram of a device 1500 such as a wireless device, transmission point or reception point, e.g., network component or a user equipment. The device 1500 includes a CPU 1502, a mass storage component 1504, a network interface 1506, an encoder/decoder 1508, memory 1510, a video adapter 1512, and an I/O interface 1514.

The device 1500 may utilize all of the components shown, or only a subset of the components, and levels of integration may vary depending on the implementation. Furthermore, the device 1500 may contain multiple instances of a component, such as multiple CPUs 1502, etc. The device 1500 may use the network interface 1506 to connect to a network 1520, the video adapter 1512 to connect to a display 1516, and the I/O interface 1514 to connect to one or more input/output devices 1518, such as a speaker, microphone, mouse, touchscreen, keypad, keyboard, printer, and the like.

In some embodiments, the CPU 1502 may be any processor which may be a component of a general-purpose computer hardware platform. In other embodiments, the CPU 1502 (a processor) may be a component of a special-purpose hardware platform. For example, the CPU 1502 may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory memory or storage medium, which could be, for example, a compact disc read-only memory (CD-ROM), universal serial bus (USB) flash disk, or a removable hard disk.

The encoder/decoder 1508 may include an encoding component, a decoding component, or both. In some embodiments, the encoder/decoder 1508 is implemented in circuitry, such as a processor, that is configured to encode data or perform the selection, mapping, and/or encoding operations as disclosed herein. In a processor-based implementation of the encoder/decoder 1508, processor-executable instructions to perform encoding operations are stored in a non-transitory processor-readable medium. The non-transitory medium could include, in the memory 1510 for example, one or more solid-state memory devices and/or memory devices with movable and possibly removable storage media.

The bus may be one or more of any type of several bus architectures including a memory bus or memory controller, a peripheral bus, video bus, or the like. The CPU 1502 may comprise any type of electronic data processor. The memory 1510 may comprise any type of system memory such as static random access memory (SRAM), dynamic random access memory (DRAM), synchronous DRAM (SDRAM), read-only memory (ROM), a combination thereof, or the like. In some embodiments, the memory 1510 is a non-transitory computer readable medium that includes instructions for execution by a processor to implement and/or control operation of the encoder/decoder 1508 or other component(s) of the device, and/or to otherwise control the execution of functionality and/or embodiments described herein. In an embodiment, the memory 1510 may include ROM for use at boot-up, and DRAM for program and data storage for use while executing programs.

The mass storage component 1504 may comprise any type of storage device configured to store data, programs, and other information and to make the data, programs, and other information accessible via the bus. The mass storage component 1504 may comprise, for example, one or more of a solid state drive, hard disk drive, a magnetic disk drive, an optical disk drive, or the like.

The video adapter 1512 and the I/O interface 1514 provide interfaces to couple external input and output devices to the processing unit. As illustrated, examples of input and output devices include the display 1516 coupled to the video adapter 1512 and the mouse/keyboard/printer coupled to the I/O interface 1514. Other devices may be coupled to the processing unit, and additional or fewer interface cards may be utilized. For example, a serial interface such as Universal Serial Bus (USB) (not shown) may be used to provide an interface for a printer.

The network interface 1506 may comprise wired links, such as an Ethernet cable or the like, and/or wireless links to access nodes or different networks. The network interface 1506 may be configured to allow the device and/or processing unit to communicate with remote units via the network 1520 including, for example, transmitting and/or receiving encoded data or bits. For example, the network interface 1506 may provide wireless communication via one or more transmitters/transmit antennas and one or more receivers/receive antennas. In an embodiment, the processing unit is coupled to a local-area network or a wide-area network for data processing and communications with remote devices, such as other processing units, the Internet, remote storage facilities, or the like.

Although not shown, the network interface 1506 could include a modulator, an amplifier, antenna and/or other modules or components of a transmit chain or alternatively could be configured to interface with a separate (Radio-Frequency—RF) transmission module. For example, the encoder/decoder 1508 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to encode data as described herein for transmission via the network interface 1506 by a separate (RF) transmission unit.

Figure 16:
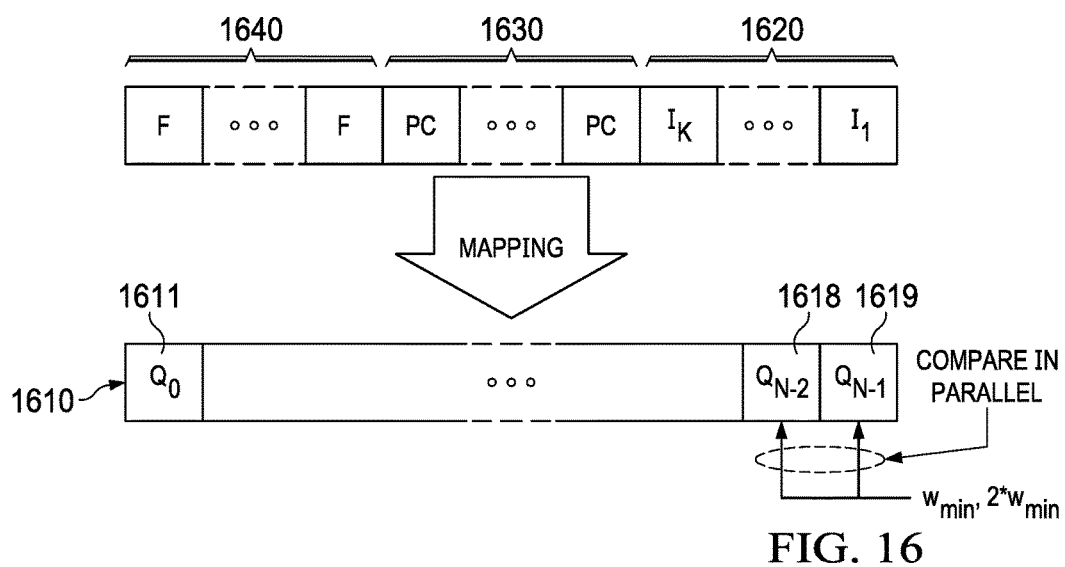
FIG. 16 is a diagram of an embodiment technique for using parallel comparison operations to identify sub-channels that are to be reserved for PC bit(s)

As discussed above, when parity bits are mapped based on row weights associated with the sub-channels, it may be necessary to compare a row weight value (e.g., a $w_{min}$, $2*w_{min}$) to the row weights of sub-channels to identify which sub-channels should be reserved for parity bit(s). Embodiments of this disclosure compare the row weight value (e.g., a $w_{min}$, $2*w_{min}$) to the row weights of multiple sub-channels in parallel. This may reduce the latency associated with the comparison operations, thereby allowing the encoding process to be performed more quickly and efficiently. FIG. 16 is a diagram of a technique for using parallel comparison operations to identify sub-channels that are to be reserved for PC bit(s). In this example, information bits 1620, PC bits 1630, and frozen bits 1640 are mapped to sub-channels 1611-1619, which are sorted in a sub-channel reliability ascending order. Prior to mapping the information bits 1620 to any of the sub-channels 1611-1619, row weights of at least two sub-channels 1618, 1619 are compared in parallel with one or more row weight values (e.g., $w_{min}$, $2*w_{min}$), and the most reliable sub-channels having a row weight that matches the one or more row weight values are reserved for the PC bits 1630. In some embodiments, a specific number ($f_1$) of sub-channels having a row weight that matches a first row weight value (e.g., $w_{min}$) are reserved for the PC bits, and a specific number ($f_2$) of sub-channels having a row weight that matches a second row weight value (e.g., $2*w_{min}$) are reserved for the PC bits. One or more of the row weight values, and indices defining the specific numbers of sub-channels reserved for each respective row weight value, may be determined based on a code rate and/or block length parameter.

Figure 17:
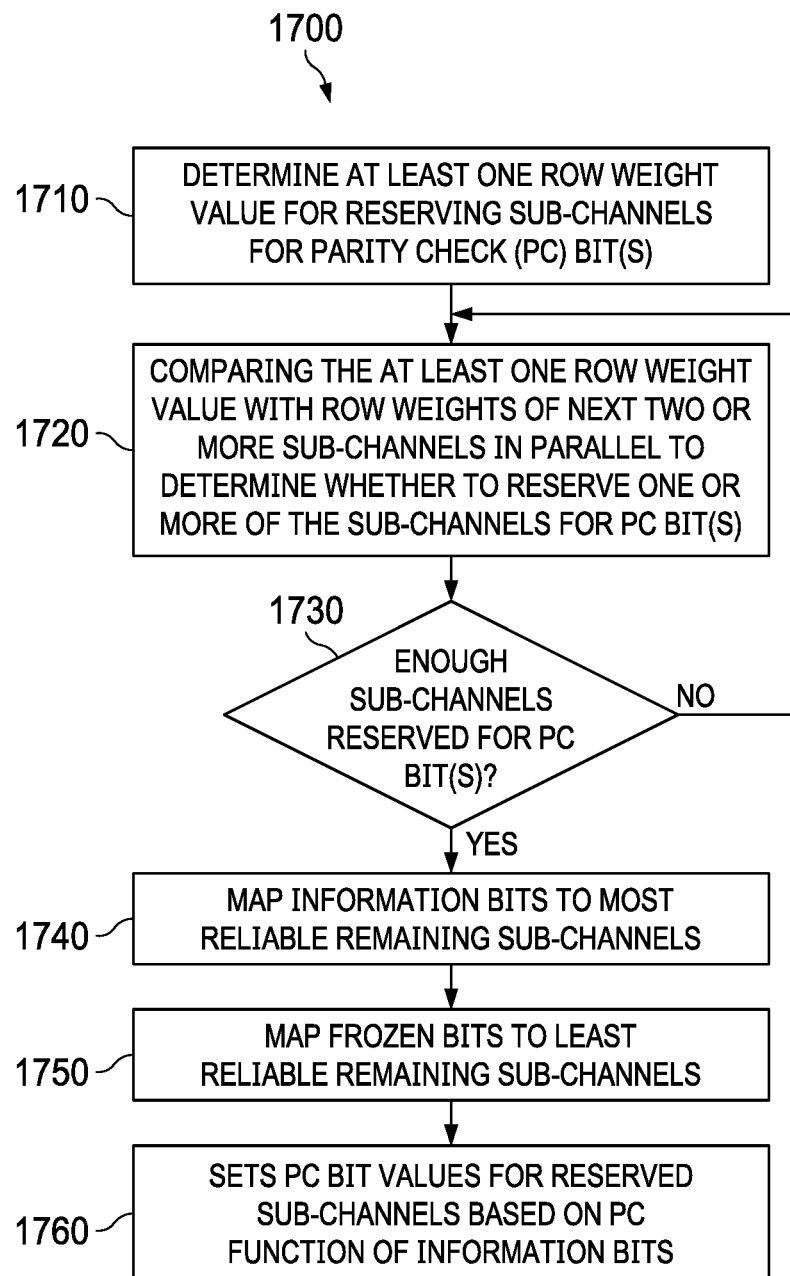
FIG. 17 is a flowchart of an embodiment method for encoding a sequence of information bits.

FIG. 17 illustrates an embodiment method 1700 for encoding a sequence of information bits. At step 1710, the encoder determines at least a row weight value for reserving sub-channels for PC bits. The at least one row weight value may be determined based on a code rate of the channel and a block length associated with a sequence of information bits to be encoded. At step 1720, the encoder compares the at least one row weight value with row weights of two or more sub-channels in parallel to determine to reserve one or more of the sub-channels for the PC bit(s). In an embodiment, the encoder may evaluate the sub-channels in reliability descending order according to an ordered sequence of sub-channels so that more reliable sub-channels are evaluated prior to less reliable sub-channels. Alternatively, all sub-channels in a sub-set of sub-channels that are to be mapped to information or PC-bits (e.g., K+Fp sub-channels) are evaluated in parallel.

At step 1730, the encoder determines whether enough sub-channels have been reserved for PC bit(s). By way of example, the encoder may determine whether at least $f_1$ sub-channels having a row weight equal to $w_{min}$ have been reserved and/or whether at least $f_2$, sub-channels having a row weight equal to $2*w_{min}$ have been reserved. If not, then the method 1700 reverts back to step 1720, where the encoder evaluates the next two or more sub-channels. Once the encoder has determined that enough sub-channels have been reserved for PC-bits, the method proceeds to step 1740, where the encoder maps information bits to the most reliable remaining sub-channels. At step 1750, the encoder maps frozen bits to the least reliable remaining sub-channels. In some embodiments, additional PC bits could be selected from the frozen bit set. In one implementation, all the frozen sub-channels having equal row weights to the at least one row weight used for reserving the sub-channels for PC bits may be selected; in another implementation, all the frozen sub-channels may be selected. At step 1760, the encoder sets the PC bit values for the reserved sub-channels based on a PC function of the information bits. Steps 1740, 1750, and 1760 may be performed in any order. Also, the number of sub-channels for PC bits may be determined in many different ways and as noted above, the number of the reserved sub-channels for PC bits may be fixed, e.g., 3 and/or some or all of the reserved sub-channels may be based on $d_{min}$.

Figure 18:
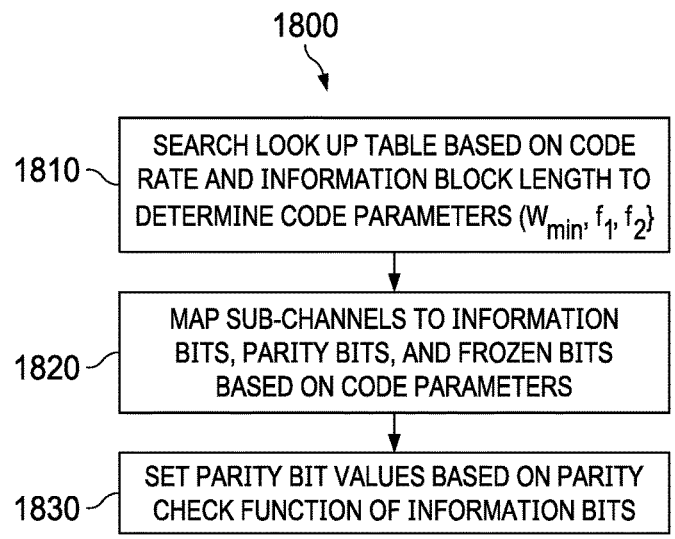
FIG. 18 is a flowchart of another embodiment method for encoding a sequence of information bits.

FIG. 18 illustrates a flowchart of a method 1800 for using a look up table to perform polar encoding, as may be performed by an encoder. At step 1810, the encoder searches the look up table based on a code rate and an information block length to determine the code parameters. At step 1820, the encoder maps sub-channels to the information bits, parity bits, and frozen bits. At step 1830, the encoder sets the parity bit values based on a parity check function of the information bits.

Figure 19:
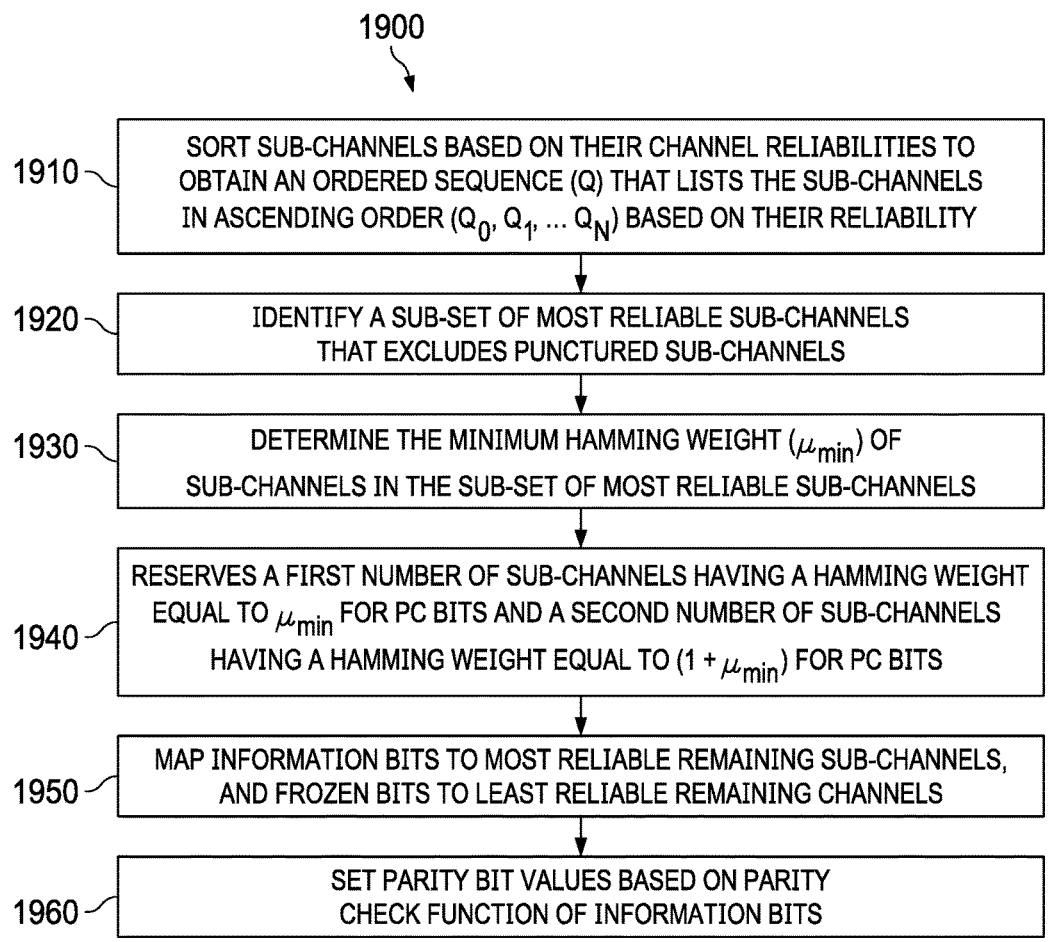
FIG. 19 is a flowchart of another embodiment method for encoding a sequence of information bits.

FIG. 19 illustrates a flowchart of a method 1900 for determining a minimum hamming weight value, as may be performed by an encoder. At step 1910, the encoder sorts sub-channels based on their channel reliabilities to obtain an ordered sequence (Q) that lists the sub-channels in ascending order ($Q_0, Q_1, \ldots Q_N$) based on their reliability. At step 1920, the encoder identifies a sub-set of most reliable sub-channels. In examples where a puncturing step is performed after the polar encoding step, the sub-set of most reliable sub-channels may exclude punctured sub-channels.

The number of sub-channels in the set of most reliable sub-channels may be determined according to the following equation: $\min(\text{length}(U_M), K+F_p)$, where $U_M$ is the set of sub-channels that will remain after puncturing, K is the length of the information block, and $F_p = \log_2 N \times (\alpha - |\alpha \times (K/M - \frac{1}{2})|^2)$, where M is the mother code length and $\alpha$ is set to a value larger than 1, e.g., $\alpha=1.5$. In some other embodiments, $F_p$ might be a fixed value, e.g., 3. At step 1930, the encoder determines a minimum hamming weight (umin) of sub-channels in the sub-set of most reliable sub-channels.

At step 1940, within the subset of the most reliable sub-channels, the encoder reserves a first number of sub-channels having a hamming weight equal to the minimum hamming weight ($u_{min}$) for PC bits and a second number of sub-channels having a hamming weight equal to one plus the minimum hamming weight ($1+u_{min}$) for PC bits. The encoder can reserve the sub-channels in a number of different ways including, for example, by scanning the ordered sequence of sub-channels in a sequential fashion. In other implementations, only a subset of the $F_p$ sub-channels are reserved based on $u_{min}$ and/or $1+u_{min}$, and a remaining subset of the $F_p$ sub-channels are reserved based on another metric, e.g., the least reliable sub-channels within the K+$F_p$ most reliable sub-channels. Once sub-channels have been reserved or otherwise allocated for PC bits, the remaining sub-channels are allocated to information and frozen bits. At step 1950, the encoder maps information bits to the most reliable remaining sub-channels, and frozen bits to the least reliable remaining sub-channels. In some embodiments, additional PC bits could be selected from the frozen bit set. In one implementation, some or all the frozen sub-channels having a Hamming weight equal to that of the reserved sub-channels for PC bits may be selected. In other embodiments, all the frozen sub-channels may be selected as PC bits. At step 1960, the encoder sets parity bit values based on parity check function of information bits. Depending on the implementation, the order in which the sub-channels are allocated may vary. Likewise, it is understood that the order in which the PC bits, information bits or frozen bits are mapped to the allocated sub-channels may also vary.

Figure 20:
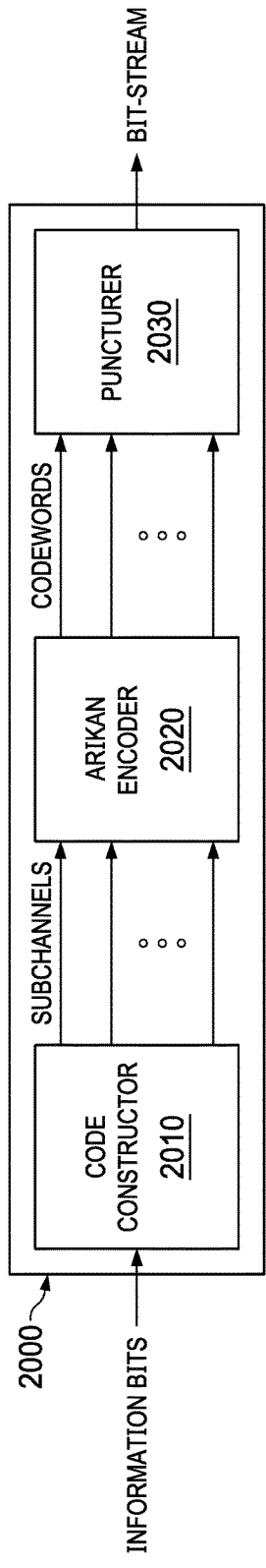
FIG. 20 is a diagram of another embodiment encoder.

In some embodiments, an Arikan encoder may be used to achieve polar encoding. FIG. 20 is a diagram of an embodiment encoder 2000. The encoder includes a code constructor 2010, an Arikan encoder 2020, and a puncturer 2030. The code constructor 2010 may determine a set of sub-channel types. Each sub-channel is mapped to an information bit, a PC bit, or a frozen bit (or vice-versa). According to polarization theory, the reliability (or mutual channel capacity) on each sub-channel are different from each other. The sub-channels with high reliability are chosen to transmit the information bits. The set of these sub-channels' positions is named as information-set (I). The sub-channels with the low reliability, including the unreliable sub-channels caused by rate matching, are set to zero and the set of their positions is denoted as frozen-set (F). Some sub-channels are selected to transmit the PC bits and the set of their positions is denoted as PC-frozen-set (PF). The total number (N) of the sub-channels of one polar block may be a power-of-two value, and may be referred to as a mother code block length (N=I+F+PF). The code constructor 2010 may also determine a set of sub-channel values based on the information bit values and sub-channels types. In particular, the sub-channels mapped to information bits may be set based on values of the information bits, the sub-channels mapped to PC bits may be set based on a parity-check function, and the sub-channels for frozen bits are set to 0. The Arikan encoder 2020 may multiply the N-sized sub-channel block by a Kronecker matrix to obtain an N-bit code word. The Arikan encoder 2020 may perform that multiplication according to the following formula:

$$[x_0, x_1, x_2, \ldots x_{N-1}] = [u_0, u_1, u_2, \ldots u_{N-1}] \begin{bmatrix} 1 & 0 & & 0 & 0 \\ 1 & 1 & \cdots & 0 & 0 \\ \vdots & & \ddots & & \vdots \\ 1 & 0 & & 1 & 0 \\ 1 & 1 & \cdots & 1 & 1 \end{bmatrix},$$

where the rightmost matrix is an N-by-N generator matrix for Arikan polar codes. The puncturer 2030 may puncture/shorten the N-bit code word into M-sized code length by a puncture-bit set (P). Given a combination of code rate (R) and code length (M), both encoder and decoder may compute this frozen-set (F), PC-frozen set (PF) and shortening/puncture-bit set (P) using the same deterministic protocol.

A polar code with a mother code length N can be modeled as a nested combination of two polar codes of length N/2. Accordingly, it is possible to construct an ordered sequence of bit positions (index sequence) such that the ordered sequence for the polar codes of length N/2 is a subset of the ordered sequence for the polar codes of length N. Such a sequence $Q_0^{Nmax-1}$ for the polar code of maximum code length $N_{max}$, where $N_{max}$ is a power of two, then covers any combination of code rate and code length (of power of two) smaller than $N_{max}$ in a nested way. Rate matching can then be performed at low complexity and with relatively fine granularity. Alternatively, the generation of different length ordered sequences may be generated offline (e.g., before the encoding operation), and parameters corresponding to each ordered sequence can be stored in a look up table.

Signal to noise ratio (SNR) independent reliability estimation may be performed by computing the reliability of each sub-channel, and storing the ordered index sequence $Q_0^{max-1}$ for the polar code of maximum code length $N_{max}$. The reliability order of sub-channels may be estimated through a weight sequence $W_0^{Nmax-1}$, which may be calculated as follows: assume $i \triangleq B_{n-1}B_{n-2} \ldots B_0$ with $B_j \in \{0, 1\}, j = [0, 1, \ldots, n-1]$, then, $$W_i = \sum_{j=0}^{n-1} B_j * 2^{j * \frac{1}{4}},$$

where $n = \log_2(N)$.

In one example, a mother code length of $N_{max}=16$, $n=\log_2(16)=4$ and for $i=3$ ($i \triangleq 0011$), $W_3$ can be calculated as: $W_3 = 1 * 2^{(0*(1/4))} + 1 * 2^{(1*(1/4))} + 0 * 2^{(2*(1/4))} = 2.1892$. The full weight vector is $W_0^{15} = [0\ 11.1892\ 2.1892\ 1.4142\ 2.4142\ 2.6034\ 3.60341.6818\ 2.6818\ 2.8710\ 3.8710\ 3.0960\ 4.0960\ 4.2852\ 5.2852]$, where a larger value suggests a higher reliability. Once $W_0^{Nmax-1}$ is obtained, the sub-channels can be sorted by polarization weight such that $W_{Q_0} \leq W_{Q_1} \leq W_{Q_2} \leq \ldots \leq W_{Q_{Nmax-1}}$. The resulting sequence to be stored is $Q_0^{15} = [0\ 1\ 2\ 4\ 8\ 3\ 5\ 6\ 9\ 10\ 12\ 7\ 11\ 13\ 14\ 15]$. Note that $Q_0^{Nmax-1}$ may either be computed on-the-fly or loaded directly from the memory so that there is no need to compute it for every encoding & decoding rate-matching operation.

A puncturing pattern may be computed in a deterministic way by bit-reversing the descending-ordered binary indices [N-1, N-2, . . . , 1, 0], and marking the N-M indices with highest bit-reversed value as punctured positions. As an example, consider the mother code length of $N_{max}=16$. Both encoder and decoder store the sequence $Q_0^{15} = [0\ 1\ 2\ 4\ 8\ 3\ 5\ 6\ 9\ 10\ 12\ 7\ 11\ 13\ 14\ 15]$. There are 4 bits (4=N-M) to be punctured to obtain the code length M, compute the length-4 puncturing pattern P by bit-reversing the sequence of [12 (1100), 13(1101), 14(1110), 15(1111)](=[M, . . . N-3, N-2, N-1]) as P=[3(0011), 11(1011), 7(0111), 15(1111)]=[BitRev (M), . . . , BitRev(N-3), BitRev (N-2), BitRev (N-1)]).

The PC-frozen-set (PF) may be determined depending on the polarization reliabilities, row-weights of Kronecker kernel and Hamming weights in terms of the sub-channel index and shortening/puncturing pattern (P). The minimum row-weight(s) ($w_{min}$) within a subset of most reliable sub-channels and sizes of each PC-frozen set ($f_1$, $f_2$) may be determined based on the code rate and information block length.

The following is an example of an embodiment five step technique for encoding a sequence of information bits.

In the first step, the encoder may compute the number of the candidate PC-frozen sub-channels according to $F_p = \log_2 N \times (\alpha - |\alpha \times (K/M - \frac{1}{2})|^2)$. The total number of pre-flagged PC-frozen bits may be less than or equal to N-K (when equal to N-K, all frozen bits are treated as PC-frozen bits). In practice, $F_p$ may be upper bounded by (N-K)/2, and a is set to a value larger than 1, e.g., α=1.5. In some other embodiments, $F_p$ may have a different function of N, M and K or be fixed.

Figure 21:
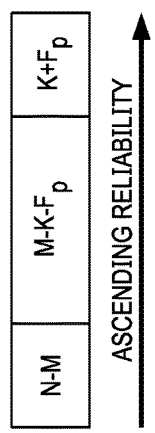
FIG. 21 is a diagram of an ordered sequence of sub-channels.

In the second step, the encoder may move the punctured/shortened sub-channels to the leftmost, and then divide the remaining sub-channels into two subsets in an ascending order of the reliabilities. An example of this is depicted by FIG. 21.

In the third step, the encoder may find the smallest row-weight within the $(K+F_p)$-subset of the sub-channels and denote it as $w_{min}$, compute $f_1=(F_p+\min(F_p,n))/2$, $f_2=(F_p-\min(F_p,n))/2$. If the number of sub-channels with weight $w_{min}$ in the $(K+F_p)$-subset is less than $f_1$, then set $f_1=n$ and add half of the remaining amount in $f_1$ to $f_2$, i.e., $f_2=f_2+(f_1-n)/2$.

In the fourth step, the encoder may select the candidate PC-frozen sub-channels in the $(K+F_p)$-subset. In doing so, the encoder may select $f_1$ sub-channels with a row-weight of $w_{min}$ from right to left and select $f_2$, sub-channels with a row-weight of $2 \times w_{min}$ from right to left as candidate PC-frozen sub-channels. In some other embodiments, a subset of $F_p$ sub-channels may be determined based on the row-weight $w_{min}$, and a remaining subset of $F_p$ sub-channels may be determined based on at least one other metric, such as the least reliable sub-channels within the $(K+F_p)$-subset.

In the fifth step, the encoder may determine the information-set, PC-frozen-set and frozen-set. In doing so, the encoder may select the information sub-channels from the rightmost to the leftmost and skip the candidate PC-frozen sub-channels until K sub-channels are chosen. The encoder may then select the remaining sub-channels as the frozen sub-channels, and select from the frozen sub-channel positions that have a row-weight equal to that of candidate PC-frozen sub-channels (i.e., $w_{min}$ and $2 \times W_{min}$) as additional PC-frozen sub-channels. In some other embodiments, all frozen sub-channels could be selected as additional PC-frozen sub-channels. If a PC-frozen bit is before the 1$^{st}$ information bit, then it may be equivalent to a frozen bit.

The encoder may perform a parity check function based on a cyclic shift on a register. The length of the register may be a prime number. The encoder may initialize a p-length cyclic shift register, y[0], . . . , y[p−1], to 0 for i=0 to N−1. Starting from the first bit in natural number order, the encoder may read the i-th bit, $a_i$, and cyclic left shift the register bit by bit. If $a_i$ is an information bit, then the bit value remains unchanged, and the encoder updates y[0]=($a_i$, XOR y[0]). If $a_i$ is a PC bit, the encoder sets $a_i$=y [0]. If $a_i$ is a frozen bit, then the encoder sets $a_i$=0.

Figure 22:
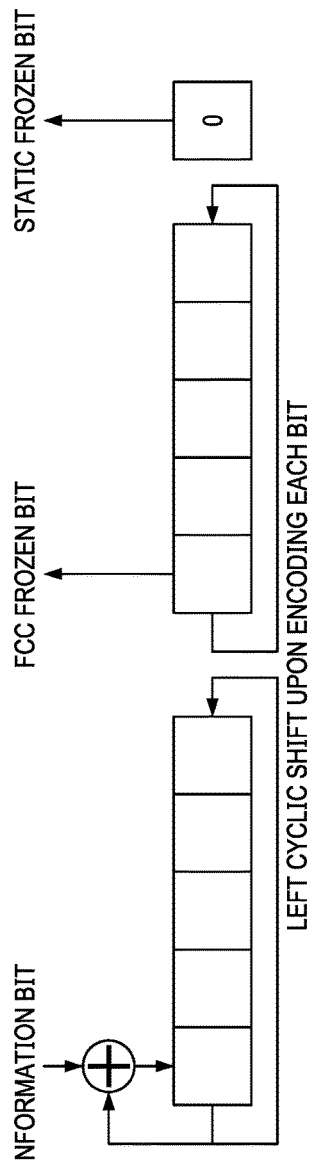
FIG. 22 is a diagram of a an embodiment cycle shift register operation used by a parity check decoder.
Figure 23:
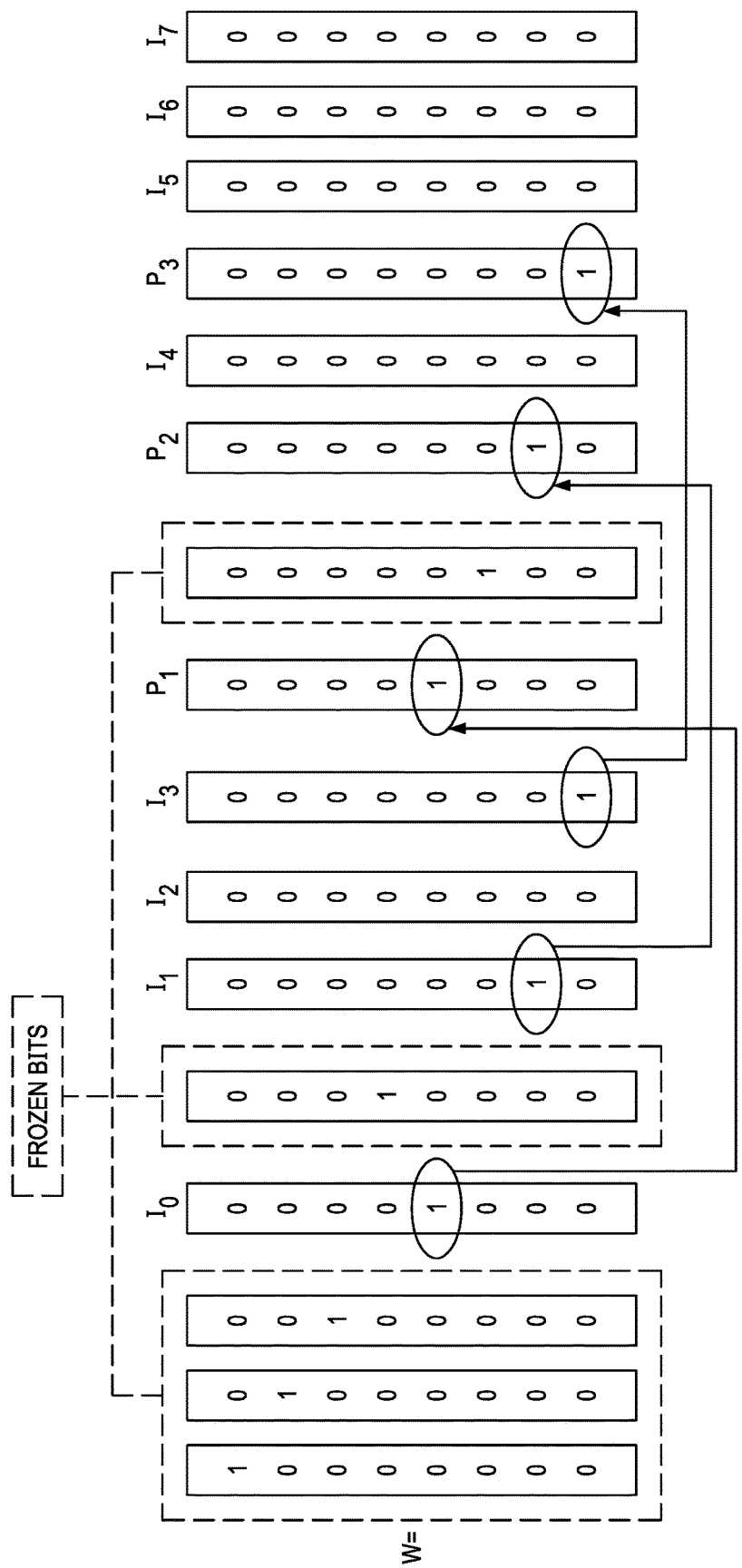
FIG. 23 is a diagram of a parity check function.

FIG. 22 illustrates an embodiment cycle shift register operation used by a PC (parity-check)-SCL decoder. A PC function may be defined by a PC matrix W. The following example will assume that the code block length is M=16, and the information bit length is K=8. From this, it is possible to obtain the following ordered sequence Q of sub-channels: [$u_0$, $u_1$, $u_2$, $u_4$, $u_8$, $u_3$, $u_5$, $u_6$, $u_9$, $u_{10}$, $u_{12}$, $u_7$, $u_{11}$, $u_{13}$, $u_{14}$, $u_{15}$]. Based on the equations provided above (e.g., $F_p=\log_2 N\times(\alpha-|\alpha\times(K/M-\frac{1}{2})|^2)$, etc.), $F_p$ is calculated as 6, and $w_{min}$ and n are 2 and 3, respectively. Because n<$F_p$, $f_1$=3 sub-channels with row-weight $w_{min}$=2 and $f_2$=3 sub-channels with row-weight $2 \times d_{min}$=4 as PC-frozen bits. By descending reliability order, these PC-frozen bits are [$u_2$, $u_4$, $u_8$, $u_9$, $u_{10}$, $u_{12}$]. The information and additional frozen bits are mapped based on the channel reliability according to Q. The information-bit set is [$u_3$, $u_5$, $u_6$, $u_7$, $u_{11}$, $u_{13}$, $u_{14}$, $u_{15}$] and the frozen-bit set is [$u_0$, $u_1$, $u_2$, $u_4$, $u_8$, $u_9$, $u_{10}$, $u_{12}$]. By selecting the frozen bits with row-weight 2 and 4, the PC-frozen-bit set is [$u_1$, $u_2$, $u_4$, $u_8$, $u_9$, $u_{10}$, $u_{12}$]. Finally, a prime-length cyclic register with p=5 is used to build parity functions for each PC-frozen bit in [$u_1$, $u_2$, $u_4$, $u_8$, $u_9$, $u_{10}$, $u_{12}$]. The cyclic register connects the bits with a constant spacing 5. Notably, $u_1$, $u_2$, $u_4$ and $u_9$ are equivalent to static-frozen bits. Additionally, $u_8$, $u_{10}$ and $u_{12}$ are mapped to PC-bits based on parity functions of [$u_3$,$u_8$], [$u_5$,$u_{10}$] and [$u_7$, $u_{12}$] (respectively), where $u_3$, $u_5$ and $u_7$ are information bits. FIG. 23 illustrates a parity-check matrix for this example. As shown, W is obtained by setting $u_0$, $u_1$, $u_2$, $u_4$, and as static frozen bits, and setting $u_8$, $u_{10}$ and $u_{12}$ as PC-bits based on self-parity-check functions such that $u_8$=$u_3$, $u_{10}$=$u_5$, $u_{12}$=$u_7$. Table 1 lists notations used throughout this disclosure.

TABLE 4

| | |
|---|---|
| K | information bits length |
| M | code block length |
| N | mother code block length, equal to $2^{\lceil \log_2(M) \rceil}$ |
| L | list size of SCL decoder |
| R | code Rate (K/M) |
| Q | ordered bits position sequence |
| P | puncture-set |
| F | Frozen-set |
| PF | PC-frozen set |
| W | parity-check matrix |
| n | number of the segments |

Figure 24:
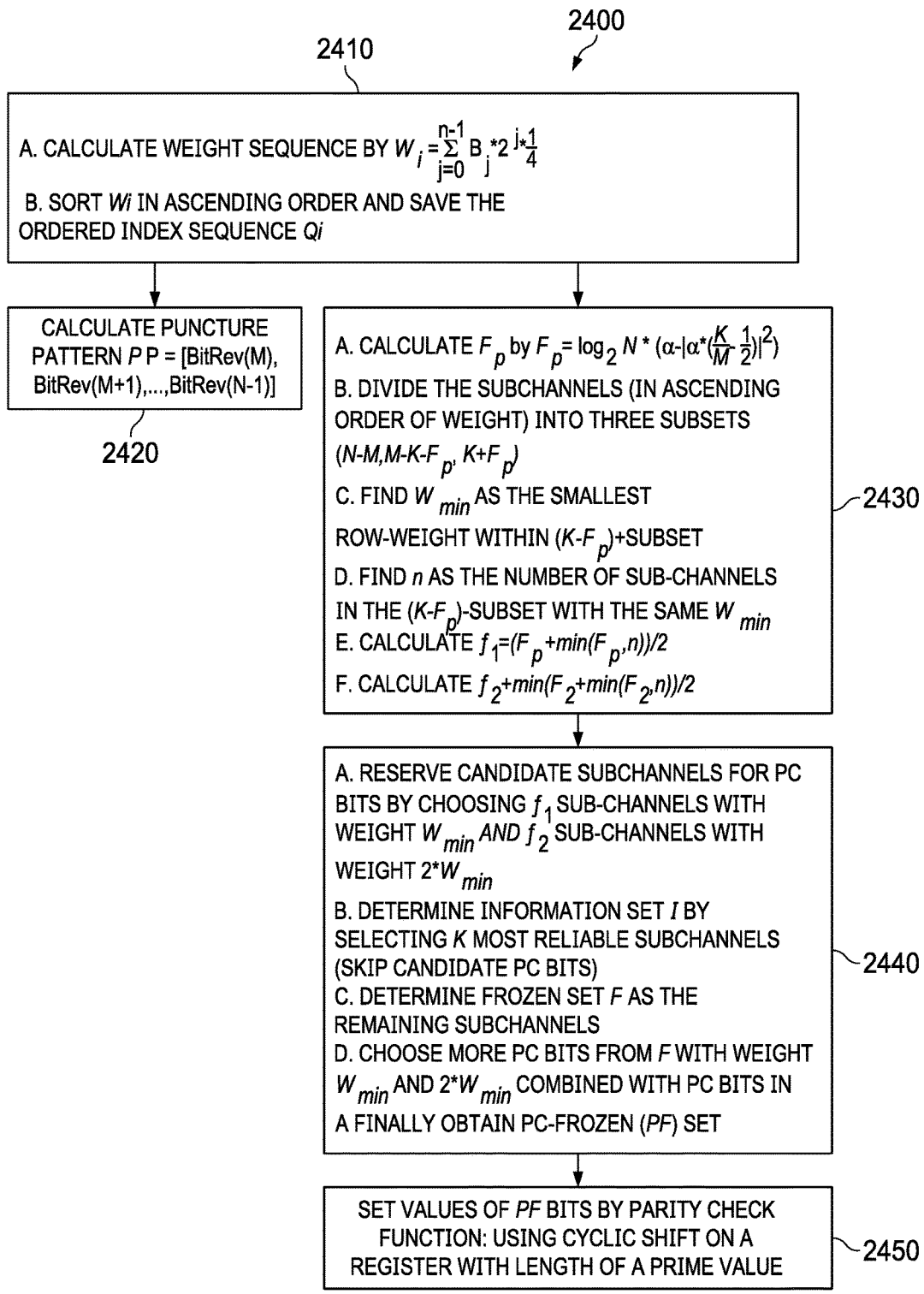
FIG. 24 is a flowchart of an embodiment method for encoding a sequence of information bits.

FIG. 24 illustrates an embodiment method 2400 for encoding a sequence of information bits, as may be performed by an encoder. At step 2410, the encoder calculates a weight sequence according to $W_i=\Sigma_{j=0}^{n-1} B_j * 2^{j*1/4}$ (where i is the index of a sub-channel, is the bit value {0 or 1} of the (j+1)th digit of the binary representation of sub-channel i counting from the least important digit), sorts $W_i$ in an ascending order, and saves the ordered index sequence Qi. At step 2420, the encoder calculates a puncturing/shortening pattern, for example, according to P=[BitRev(M), BitRev(M+1), BitRev (N−1)]). Other puncturing/shortening patterns may also be possible. At step 2430, the encoder calculates $F_p$ by $F_p=\log_2 N\times(\alpha-|\alpha\times(K/M-\frac{1}{2})|^2)$, divides the sub-channels (in ascending order of weight or reliability) into three subsets: N−M, M−K−Fp, K+Fp, where the K+Fp subset contains the most reliable sub-channels (when puncturing/shortening is considered). The encoder also finds $w_{min}$ as the smallest row-weight within the (K+Fp)-subset, finds n as the number of sub-channels in the (K+Fp)-subset with the same $w_{min}$, calculates f1=(Fp+min(Fp,n))/2, and calculates f2=(Fp−min(Fp,n))/2. At step 2440, the encoder reserves or otherwise allocates candidate sub-channels for PC bits in the K+Fp subset by choosing f1 sub-channels with weight $w_{min}$ and f2 sub-channels with weight 2*$w_{min}$. In some embodiments, $F_p$ could be a fixed value, e.g., 3. In other embodiments, only a subset of $F_p$ sub-channels for PC bits are selected based on the row weight $w_{min}$ and/or 2*$w_{min}$, and a remaining subset of $F_p$ sub-channels for PC bits is selected based on at least on other metrics, e.g., the least reliable sub-channels within the most reliable K+$F_p$ sub-channels. Once candidate PC sub-channels have been allocated, the encoder also allocates K (most reliable remaining) sub-channels in the K+Fp subset (i.e., skipping the reserved candidate PC sub-channels) and maps information bits thereto to obtain the Information set I. The encoder also maps frozen bits to the remaining sub-channels (e.g. the N−M and/or M−K−Fp subset) to obtain a Frozen Set (F). In other embodiments, the encoder reserves or allocates additional sub-channels for PC bits from the frozen set F. The additional sub-channels chosen from the frozen set F may have row weights equal to $w_{min}$ and/or 2*$w_{min}$, or all the frozen set F could be treated as the additional sub-channels for PC bits. The reserved sub-channels may be mapped to PC bits to obtain a PC frozen set PF. At step 2450, the encoder sets values of the PC bits based on a parity check function using a cyclic shift in a register. The register may have a length that is equal to a prime number. Depending on the implementation, the order in which the sub-channels are allocated may vary. Likewise, the order in which the PC bits, information bits or frozen bits are mapped to the allocated sub-channels may also vary.

Figure 25:
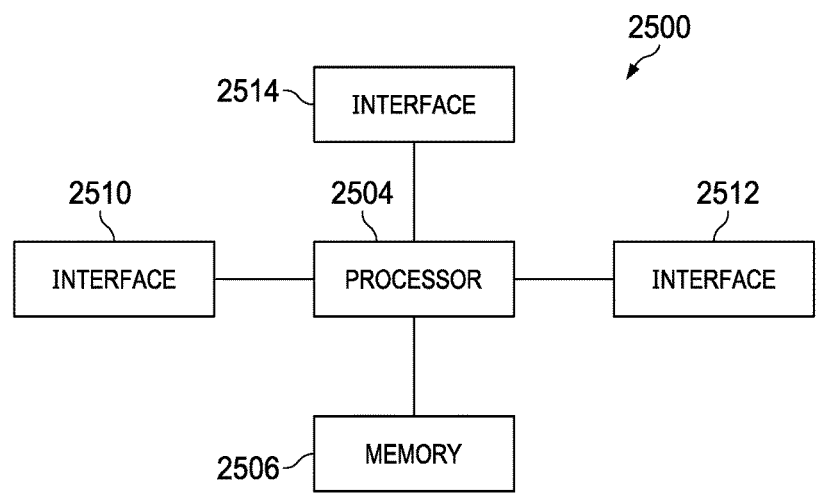
FIG. 25 is a block diagram of an embodiment processing system.

FIG. 25 illustrates a block diagram of an embodiment processing system 2500 for performing the encoding methods described herein, which may be installed in a host device. As shown, the processing system 2500 includes a processor 2504, a memory 2506, and interfaces 2510-2514, which may (or may not) be arranged as shown in FIG. 25. The processor 2504 may be any component or collection of components adapted to perform computations and/or other processing related tasks such as the selection, mapping and/or other encoding operations described herein, and the memory 2506 may be any component or collection of components adapted to store programming and/or instructions for execution by the processor 2504. In an embodiment, the memory 2506 includes a non-transitory computer readable medium. The interfaces 2510, 2512, 2514 may be any component or collection of components that is configured to allow the processing system 2500 to communicate with other devices/components and/or a user such as to allow the transmission or reception of encoded data. For example, one or more of the interfaces 2510, 2512, 2514 may be adapted to communicate data, control, or management messages from the processor 2504 to applications installed on the host device and/or a remote device. As another example, one or more of the interfaces 2510, 2512, 2514 may be adapted to allow a user or user device (e.g., personal computer (PC), etc.) to interact/communicate with the processing system 2500. The processing system 2500 may include additional components not depicted in FIG. 25, such as long term storage (e.g., non-volatile memory, etc.).

In some embodiments, the processing system 2500 is included in a network device that is accessing, or part otherwise of, a telecommunications network. In one example, the processing system 2500 is in a network-side device in a wireless or wireline telecommunications network, such as a base station, a relay station, a scheduler, a controller, a gateway, a router, an applications server, or any other device in the telecommunications network. In other embodiments, the processing system 2500 is in a user-side device accessing a wireless or wireline telecommunications network, such as a mobile station, a user equipment (UE), a wireless device, a personal computer (PC), a tablet, a wearable communications device (e.g., a smartwatch, etc.), or any other device adapted to access a telecommunications network.

Figure 26:
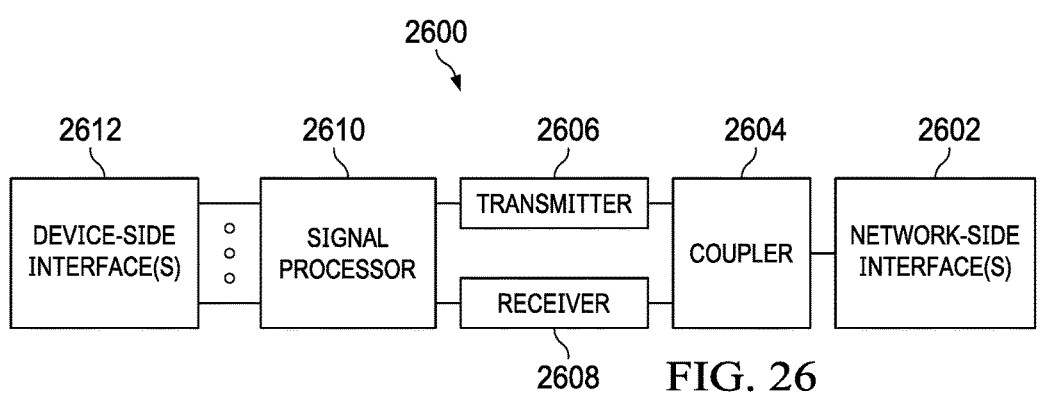
FIG. 26 is a block diagram of an embodiment transceiver.

In some embodiments, one or more of the interfaces 2510, 2512, 2514 connects the processing system 2500 to a transceiver adapted to transmit and receive signaling over the telecommunications network. FIG. 26 illustrates a block diagram of a transceiver 2600 adapted to transmit and receive signaling or encoded data over a telecommunications network. The transceiver 2600 may be installed in a host device. As shown, the transceiver 2600 comprises a network-side interface 2602, a coupler 2604, a transmitter 2606, a receiver 2608, a signal processor 2610, and a device-side interface 2612. The network-side interface 2602 may include any component or collection of components adapted to transmit or receive signaling over a wireless or wireline telecommunications network. The coupler 2604 may include any component or collection of components adapted to facilitate bi-directional communication over the network-side interface 2602. The transmitter 2606 may include any component or collection of components (e.g., up-converter, power amplifier, etc.) adapted to convert a baseband signal into a modulated carrier signal suitable for transmission over the network-side interface 2602. The receiver 2608 may include any component or collection of components (e.g., down-converter, low noise amplifier, etc.) adapted to convert a carrier signal received over the network-side interface 2602 into a baseband signal. The signal processor 2610 may include any component or collection of components adapted to convert a baseband signal into a data signal suitable for communication over the device-side interface(s) 2612, or vice-versa. The device-side interface(s) 2612 may include any component or collection of components adapted to communicate data-signals between the signal processor 2610 and components within the host device (e.g., the processing system 2500, local area network (LAN) ports, etc.).

The transceiver 2600 may transmit and receive signaling over any type of communications medium. In some embodiments, the transceiver 2600 transmits and receives signaling over a wireless medium. For example, the transceiver 2600 may be a wireless transceiver adapted to communicate in accordance with a wireless telecommunications protocol, such as a cellular protocol (e.g., long-term evolution (LTE), etc.), a wireless local area network (WLAN) protocol (e.g., Wi-Fi, etc.), or any other type of wireless protocol (e.g., Bluetooth, near field communication (NFC), etc.). In such embodiments, the network-side interface 2602 comprises one or more antenna/radiating elements. For example, the network-side interface 2602 may include a single antenna, multiple separate antennas, or a multi-antenna array configured for multi-layer communication, e.g., single input multiple output (SIMO), multiple input single output (MISO), multiple input multiple output (MIMO), etc. In other embodiments, the transceiver 2600 transmits and receives signaling over a wireline medium, e.g., twisted-pair cable, coaxial cable, optical fiber, etc. Specific processing systems and/or transceivers may utilize all of the components shown, or only a subset of the components, and levels of integration may vary from device to device.

What is claimed is:

1. A polar encoding method comprising:
   encoding, by a device, information bits and at least one parity check bit using a polar code to obtain encoded bits, the polar code associated with a plurality of sub-channels, and the at least one parity check bit being placed in at least one sub-channel of the plurality of sub-channels, wherein the at least one sub-channel is obtained from a segment of a plurality of segments of the plurality of sub-channels based on a minimal weight of the segment of the plurality of segments of the plurality of sub-channels; and
   outputting, by the device, the encoded bits obtained from the information bits and the at least one parity check bit.

2. The method of claim 1, wherein the plurality of sub-channels are ordered based on a reliability metric, and wherein the at least one sub-channel is obtained from the segment of the plurality of segments of the plurality of ordered sub-channels based on the minimal weight.

3. The method of claim 2, wherein the segment of the plurality of segments of the plurality of ordered sub-channels comprises K sub-channels, where K is an information block length.

4. The method of claim 3, wherein the at least one sub-channel is obtained from the K sub-channels of the segment of the plurality of segments of the plurality of ordered sub-channels such that:
if a number of sub-channels obtained based on the minimal weight from the K sub-channels is greater than a predetermined value F, F sub-channels are obtained from the K sub-channels based on the minimal weight and in a descending order of the reliability metric.

5. The method of claim 4, wherein a row-weight of a sub-channel is a number of ones in a row of a Kronecker matrix, the row corresponding to the sub-channel, and the minimal weight being a lowest row-weight of any sub-channel in the K sub-channels.

6. The method of claim 1, wherein the encoding further comprises, for each sub-channel of the plurality of sub-channels, shifting a cyclic shift register, and:
for an information bit of the information bits, performing an XOR operation with the information bit and a bit of the cyclic shift register; or
for a parity check bit of the at least one parity check bit, retrieving the parity check bit from the cyclic shift register.

7. The method of claim 6, wherein the cyclic shift register has a length of 5.

8. A device comprising:
an encoder configured to encode information bits and at least one parity check bit using a polar code to obtain encoded bits, the polar code associated with a plurality of sub-channels, and the at least one parity check bit being placed in at least one sub-channel of the plurality of sub-channels, wherein the at least one sub-channel is obtained from a segment of a plurality of segments of the plurality of sub-channels based on a minimal weight of the segment of the plurality of segments of the plurality of sub-channels; and
an interface configured to output the encoded bits obtained from the information bits and the at least one parity check bit.

9. The device of claim 8, wherein the plurality of sub-channels are ordered based on a reliability metric, and wherein the at least one sub-channel is obtained from the segment of the plurality of segments of the plurality of ordered sub-channels based on the minimal weight.

10. The device of claim 9, wherein the segment of the plurality of segments of the plurality of ordered sub-channels comprises K sub-channels, where K is an information block length.

11. The device of claim 10, wherein the at least one sub-channel is obtained from the K sub-channels of the segment of the plurality of segments of the plurality of ordered sub-channels such that:
if a number of sub-channels obtained based on the minimal weight from the K sub-channels is greater than a predetermined value F, F sub-channels are obtained from the K sub-channels based on the minimal weight and in a descending order of the reliability metric.

12. The device of claim 11, wherein a row-weight of a sub-channel is a number of ones in a row of a Kronecker matrix, the row corresponding to the sub-channel, and the minimal weight being a lowest row-weight of any sub-channel in the K sub-channels.

13. The device of claim 8, wherein the encoder is further configured to, for each sub-channel of the plurality of sub-channels, shift a cyclic shift register, and:
for an information bit of the information bits, perform an XOR operation with the information bit and a bit of the cyclic shift register; or
for a parity check bit of the at least one parity check bit, retrieve the parity check bit from the cyclic shift register.

14. The device of claim 13, wherein the cyclic shift register has a length of 5.

15. A device comprising:
a processor; and
a non-transitory computer readable storage medium storing programming for execution by the processor, the programming including instructions to:
encode information bits and at least one parity check bit using a polar code to obtain encoded bits, the polar code associated with a plurality of sub-channels, and the at least one parity check bit being placed in at least one sub-channel of the plurality of sub-channels, wherein the at least one sub-channel is obtained from a segment of a plurality of segments of the plurality of sub-channels based on a minimal weight of the segment of the plurality of segments of the plurality of sub-channels; and
output the encoded bits obtained from the information bits and the at least one parity check bit.

16. The device of claim 15, wherein the plurality of sub-channels are ordered based on a reliability metric, and wherein the at least one sub-channel is obtained from the segment of the plurality of segments of the plurality of ordered sub-channels based on the minimal weight.

17. The device of claim 16, wherein the segment of the plurality of segments of the plurality of ordered sub-channels comprises K sub-channels, where K is an information block length.

18. The device of claim 17, wherein the at least one sub-channel is obtained from the K sub-channels of the segment of the plurality of segments of the plurality of ordered sub-channels such that:
if a number of sub-channels obtained based on the minimal weight from the K sub-channels is greater than a predetermined value F, F sub-channels are obtained from the K sub-channels based on the minimal weight and in a descending order of the reliability metric.

19. The device of claim 18, wherein a row-weight of a sub-channel is a number of ones in a row of a Kronecker matrix, the row corresponding to the sub-channel, and the minimal weight being a lowest row-weight of any sub-channel in the K sub-channels.

20. The device of claim 15, wherein the programming further includes instructions to, for each sub-channel of the plurality of sub-channels, shift a cyclic shift register, and:
for encoding an information bit of the information bits, perform an XOR operation with the information bit and a bit of the cyclic shift register; or
for encoding a parity check bit of the at least one parity check bit, retrieve the parity check bit from the cyclic shift register.

21. The device of claim 20, wherein the cyclic shift register has a length of 5.

22. A decoding method comprising:
receiving, by a device, encoded bits obtained from information bits and of at least one parity check bit; and
decoding the encoded bits using a polar code to obtain the information bits and the at least one parity check bit, the polar code associated with a plurality of sub-channels, and the at least one parity check bit being placed in at least one sub-channel of the plurality of sub-channels, wherein the at least one sub-channel is obtained from a segment of a plurality of segments of the plurality of sub-channels based on a minimal weight of the segment of the plurality of segments of the plurality of sub-channels.

23. The method of claim 22, wherein the plurality of sub-channels are ordered based on a reliability metric, and wherein the at least one sub-channel is obtained from the segment of the plurality of segments of the plurality of ordered sub-channels based on the minimal weight.

24. The method of claim 23, wherein the segment of the plurality of segments of the plurality of ordered sub-channels comprises K sub-channels, where K is an information block length.

25. The method of claim 24, wherein a row-weight of a sub-channel is a number of ones in a row of a Kronecker matrix, the row corresponding to the sub-channel, and the minimal weight being a lowest row-weight of any sub-channel in the K sub-channels.

26. The method of claim 24, wherein the at least one sub-channel is obtained from the K sub-channels of the segment of the plurality of segments of the plurality of ordered sub-channels such that:
    if a number of sub-channels obtained based on the minimal weight from the K sub-channels is greater than a predetermined value F, F sub-channels are obtained from the K sub-channels based on the minimal weight and in a descending order of the reliability metric.

27. The method of claim 22, wherein the decoding further comprises, for each sub-channel of the plurality of sub-channels, shifting a cyclic shift register, and:
    for decoding the encoded bits to obtain an information bit of the information bits, performing an XOR operation with the obtained information bit and a bit of the cyclic shift register; or
    for decoding the encoded bits to obtain a parity check bit of the at least one parity check bit, comparing the obtained parity check bit to a bit of the cyclic shift register.

28. The method of claim 27, wherein the cyclic shift register has a length of 5.

* * * * *